United States Patent [19]

Yilmaz et al.

[11] Patent Number: 5,429,964
[45] Date of Patent: Jul. 4, 1995

[54] LOW ON-RESISTANCE POWER MOS TECHNOLOGY

[75] Inventors: Hamza Yilmaz, Saratoga; Fwu-Iuan Hshieh, San Jose; Mike Chang, Cupertino; Jun W. Chen, Saratoga; King Owyang, Atherton; Dorman C. Pitzer, San Ramon; Jan Van Der Linde, Saratoga, all of Calif.

[73] Assignee: Siliconix incorporated, Santa Clara, Calif.

[21] Appl. No.: 180,265

[22] Filed: Jan. 12, 1994

Related U.S. Application Data

[60] Division of Ser. No. 881,589, May 12, 1992, Pat. No. 5,304,831, which is a continuation-in-part of Ser. No. 631,573, Dec. 21, 1990, abandoned.

[51] Int. Cl.$^6$ ............................................. H01L 21/335
[52] U.S. Cl. ......................................... 437/41; 437/154
[58] Field of Search ....................... 437/41, 154, 27–30; 257/335–338

[56] References Cited

U.S. PATENT DOCUMENTS

| | | | |
|---|---|---|---|
| 4,191,603 | 3/1980 | Garbarino et al. | 148/187 |
| 4,375,999 | 3/1983 | Nawata et al. | 148/187 |
| 4,399,449 | 8/1983 | Herman et al. | 357/53 |
| 4,532,534 | 7/1985 | Ford et al. | 357/23.4 |
| 4,584,025 | 4/1986 | Takaoka et al. | 148/1.5 |
| 4,593,302 | 6/1986 | Lidow et al. | 357/23.4 |
| 4,680,853 | 7/1987 | Lidow et al. | 357/23.4 |
| 4,819,044 | 4/1989 | Murakami | 357/23.4 |
| 4,974,059 | 11/1990 | Kinzer | 357/23.4 |
| 4,982,249 | 1/1991 | Kim et al. | 357/23.4 |
| 5,016,066 | 5/1991 | Takahashi | 357/23.4 |
| 5,034,346 | 7/1991 | Alter | 437/187 |
| 5,094,900 | 3/1992 | Langley | 428/131 |
| 5,171,699 | 12/1992 | Hutter et al. | 437/41 |
| 5,268,586 | 12/1993 | Mukherjee et al. | 257/335 |
| 5,298,442 | 3/1994 | Bulucea et al. | 437/40 |

FOREIGN PATENT DOCUMENTS

| | | |
|---|---|---|
| 59-141267 | 8/1984 | Japan . |
| 60-249367 | 12/1985 | Japan . |
| 61-80860 | 4/1986 | Japan . |
| 3273180 | 7/1991 | Japan . |
| 2134705 | 8/1984 | United Kingdom . |
| 2137811 | 10/1984 | United Kingdom . |
| 2166290 | 4/1986 | United Kingdom . |
| 2033658 | 5/1990 | United Kingdom . |

OTHER PUBLICATIONS

Takemura, H. "BSA Technology for Sub-100nm Deep Base Bipolar Transistors," IEEE, (1987) p. IEDM-87-375+.

Antognetti, *Power Imtegrated Circuits: Physics, Design, and Applications* (McGraw-Hill Book Co.), 1986, pp. 3.14–3.27.

Baliga, *Modern Power Devices* (Wiley-Interscience), 1987, pp. 62–131.

"SMP60N06, 60N05, SMP50N06, 50N05, N-Channel Enhancement Mode Transistors," MOSPOWER Data Book, Siliconix inc., 1988, pp. 4-423-4-426.

Primary Examiner—Olik Chaudhuri
Assistant Examiner—S. Mulpuri
Attorney, Agent, or Firm—Skjerven, Morrill, MacPherson, Franklin & Friel; Ronald J. Meetin; David H. Carroll

[57] ABSTRACT

A submicron channel length is achieved in cells having sharp corners, such as square cells, by blunting the corners of the cells. In this way, the three dimensional diffusion effect is minimized, and punch through is avoided. Techniques are discussed for minimizing defects in the shallow junctions used for forming the short channel, including the use of a thin dry oxide rather than a thicker steam thermal over the body contact area, a field shaping p+ diffusion to enhance breakdown voltage, and TCA gathering. Gate-source leakage is reduced with extrinsic gathering on the poly backside, and intrinsic gathering due to the choice of starting material. Five masking step and six masking step processes are also disclosed for manufacturing a power MOSFET structure. This power MOSFET structure has an active region with a plurality of active cells as well as a termination region with a field ring or a row of inactive cells and a polysilicon field plate.

22 Claims, 20 Drawing Sheets

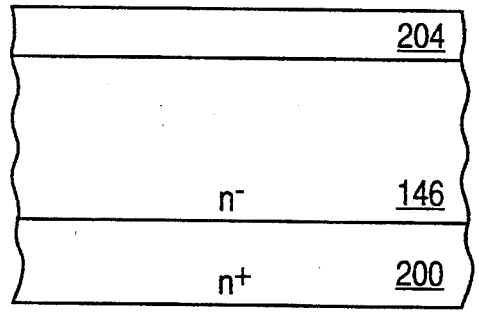
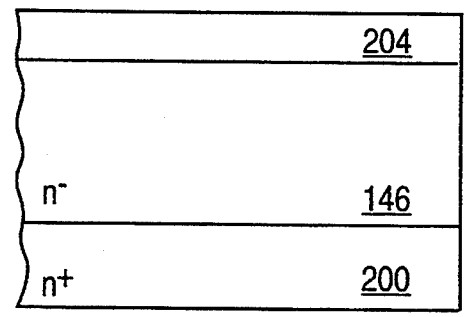
FIG. 7A          FIG. 7B
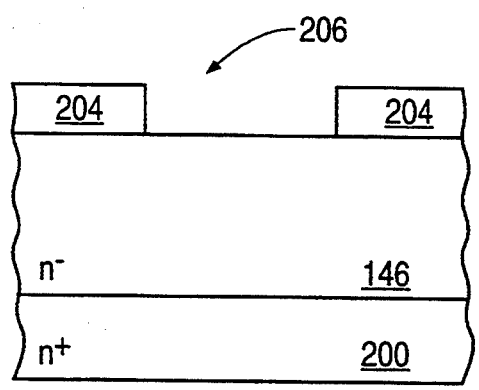
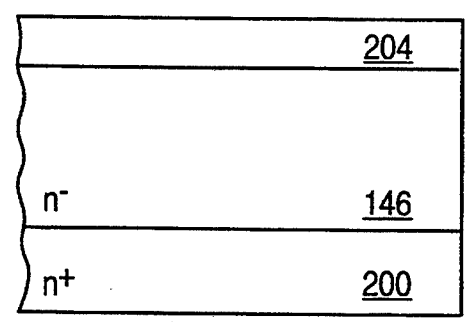
FIG. 8A          FIG. 8B

LOW ON-RESISTANCE POWER MOS TECHNOLOGY

CROSS-REFERENCE TO RELATED APPLICATIONS

This is a division of U.S. patent application Ser. No. 07/881,589, filed May 12, 1992, now U.S. Pat. No. 5,304,831, which is a continuation-in-part of U.S. patent application Ser. No. 07/631,573, filed Dec. 21, 1990, now abandoned.

BACKGROUND OF THE INVENTION

1. Field of the Invention

The present invention relates to the fabrication of integrated circuit structures, and more particularly to the fabrication of low defect DMOSFETs and associated termination structures.

2. Description of Related Art

Power MOSFET devices enjoy widespread use in such applications as automobile electrical systems, power supplies, and power management applications. Many such devices are commercially available, but an illustrative device is product number SMP60N05, available from Siliconix incorporated, Santa Clara, Calif. This device is an N-channel enhancement mode transistor packaged in a TO-220AB case. The technology used to fabricate the SMP60N05 product is characterized by a specific on-resistance of 3.5 milliohms-cm$^2$.

Many different processes have been used for the fabrication of power MOSFET devices over the years. These are generally deep diffusion processes. For example, in one early process disclosed in Great Britain Patent Application Publication No. 2 033 658 A, published May 21, 1980 and naming Lidow et al. as coinventors, a p+ tub region is about 4 microns deep and a p+ body region is about 3 microns deep. The cell configuration is hexagonal.

The technology used to fabricate the SMP60N05 product typically achieves junction depths rangeing from 2.5 to 5 microns for the body, from 5 to 6 microns for the p+ body contact, and from 0.5 to 1 micron for the n+ source regions. The cell configuration is square.

SUMMARY OF THE INVENTION

The present invention facilitates the realization of a reduced $r_{DS(on)}$ and a higher MOSFET cell density, which promotes more efficient load management switching and allows the use of smaller or no heat sinks. In another respect, the present invention facilitates the realization of a lower gate charge for the same specified on-resistance of earlier devices, which allows the use of small drive circuits and fewer components.

These and other advantages are variously realized in different embodiments of the present invention. In one embodiment, an intermediary of a power MOSFET cell, each corner of a double diffusion defining perimeter is greater than 120 degrees. In another embodiment, a method for forming a silicon power MOS device on a silicon body comprises the steps of forming a first mask overlaying the silicon body; opening a window though the first mask into a diffusion site in the silicon body; diffusing a first dopant into the diffusion site through the window; removing the first mask from the silicon body; providing an oxide layer of less than about 1000 Angstroms in thickness over the diffusion site and proximate regions of the silicon body; and providing a second mask thicker than the first mask over at least a portion of the diffusion site; and diffusing a second dopant. Yet another embodiment of the invention, a termination structure for a power device, comprises a silicon body; a gate oxide overlaying the silicon body; and a polysilicon layer overlaying the gate oxide in a scribe region of the power device. Still another embodiment is described in which only five process masking steps are required to fabricate DMOSFET devices and an associated termination structure.

BRIEF DESCRIPTION OF THE DRAWINGS

In the figures, where like reference numerals indicate like parts,

FIGS. 7A–17A ad 7B–17B show various stages in the fabrication of a device in accordance with the present invention;

FIGS. 21A–21K and 24A and 24B show various stages in the fabrication of a DMOSFET device and an associated termination structure in accordance with a second embodiment of a five masking step embodiment of the present invention.

DETAILED DESCRIPTION OF THE INVENTION

Figure 1:
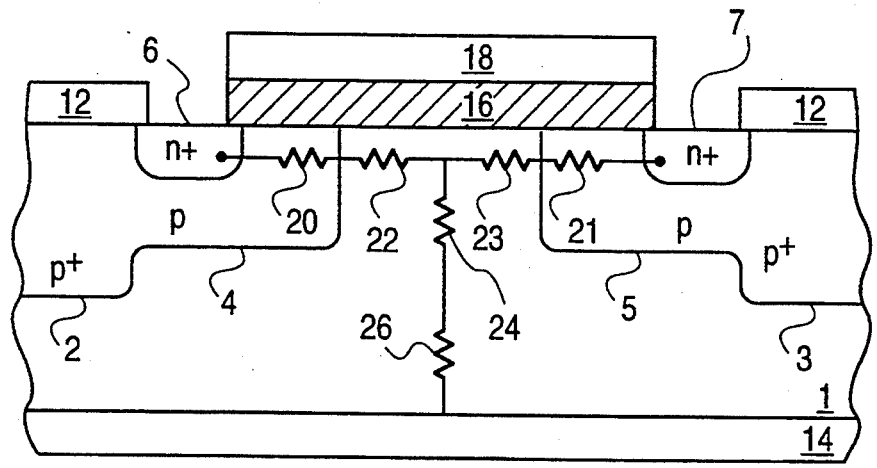
FIG. 1 is a schematic representation of a general n-channel power MOSFET with its simplified resistive equivalent circuit.

A cross-sectional structure of an n-channel power MOSFET with its simplified resistive equivalent circuit is illustrated in FIG. 1. An n-type lightly doped epitaxial silicon layer 1 includes various diffused regions such as the deep p+ regions 2 and 3, p body regions 4 and 5, and n+ source regions 6 and 7. A typically continuous source-body electrode 12 extends across certain surface portions of the epitaxial layer 1. A drain electrode 14 is provided at the backside of the n+doped substrate (not separately shown). An insulated gate structure comprising gate oxide 16 and polysilicon 18 is provided over the drain and portions of the body, the latter functioning as MOSFET channel regions. The principal elements of the simplified resistive circuit include the channel resistances 20 and 21, the JFET resistance 22, 23 and 24, and the epi resistance 26.

Figure 2:
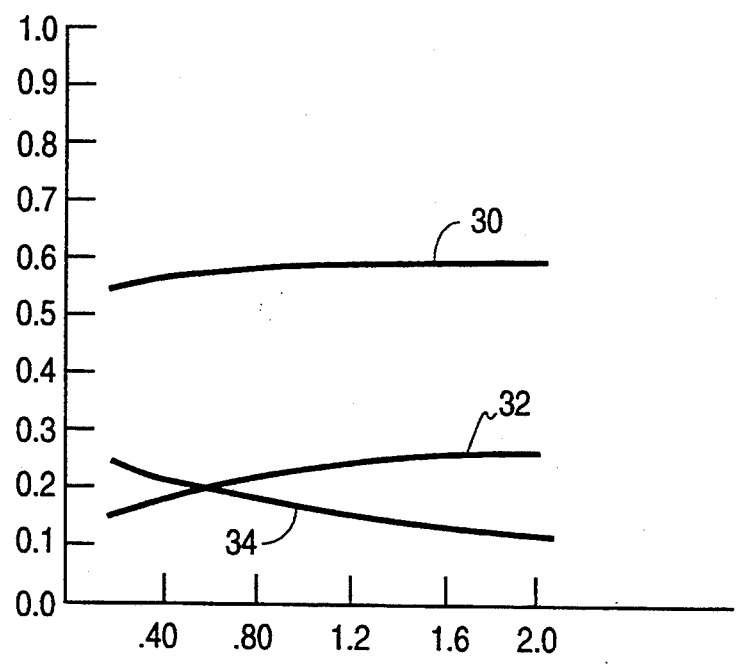
FIG. 2 is a graph showing three voltage ratios.

FIG. 2 is a graph showing the on-resistance contribution of the channel regions 20 and 21, the JFET region 22, 23 and 24, and the epi region 26 for an arbitrary 60 volt n-channel DMOSFET. $V_{GS}$ is 10 volts, temperature is 25 degrees C, each square cell measures 10 microns by 10 microns, and the cell-to-cell spacing is 6 microns. Curve 30 represents the ratio of the channel resistance 20 to $R_{DS}$, curve 32 represents the ratio of the JFET resistance 24 to $R_{DS}$, and curve 34 represents the ratio of the epi resistance 26 to $R_{DS}$. As is apparent, on-resistance is dominated by the channel resistance 20 and 21, the JFET resistance 24 is generally of secondary significance, and the epi resistance 26 is generally of tertiary significance.

Figure 3:
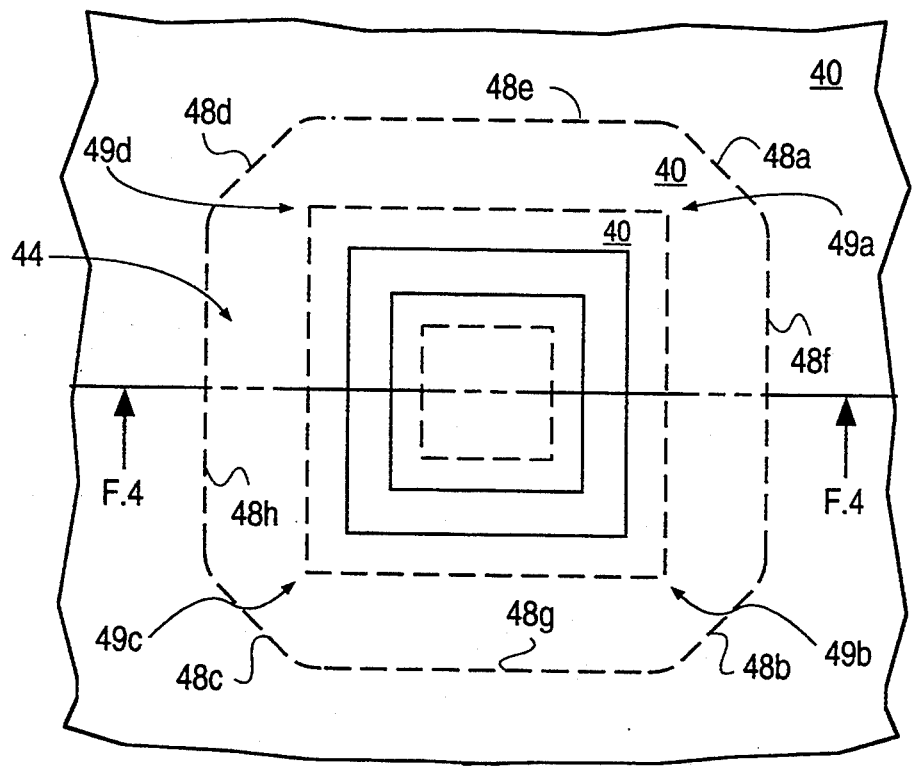
FIG. 3 is a plan view of a square cell.
Figure 4:
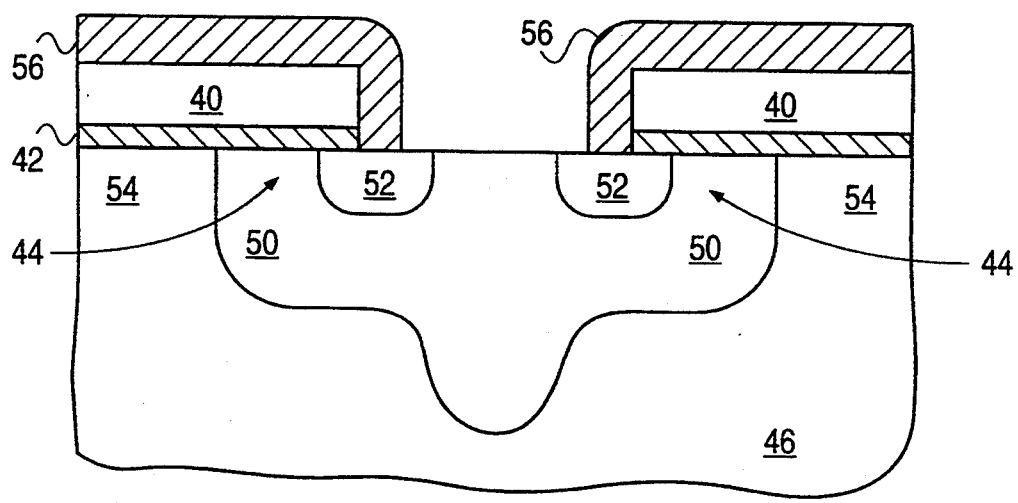
FIG. 4 is a cross sectional view of the square cell of FIG. 3.

We have discovered that the use of a modified square cell in conjunction with shallow p body, p tub, and p+ diffusions results in reduced channel resistance 20 and 21 and reduced JFET resistance 24 while avoiding punch-through due to three dimensional effects at the cell corners. A typical square cell such as used in the previously mentioned product number SMP60N05 is shown in FIGS. 3 and 4, prior to metallization. The edge of the polysilicon gate 40, which overlays gate oxide 42, is used in the double diffusion process to define the channel 44. The channel lies within p body region 50, between source region 52 and drain region 54 in the epitaxial layer 46. Typically, the channel length for the square cells of any given device is in the range of from about 1.5 microns to about 4 microns, reflecting the comparatively deep drive-in used to form the variously doped epitaxial regions described above. The polysilicon gate 40 is covered with a layer of oxide 56.

An effect known as the three dimensional diffusion phenomenon generally does not cause too much of a problem in the cell of FIGS. 3 and 4, although it is evident in the plan view of FIG. 3. The first diffusion of the double diffusion process, which is described in detail below, is a rather light p-type diffusion which is strongly driven in to a depth of from 2.5 microns to 5 microns. Generally, p-type dopant diffuses horizontally at a rate of about 80 percent of vertical diffusion. Due to the spreading effect in the corners, the effective rate of horizontal diffusion is much less, on the order of merely 50 percent. The result is that diffusion does not advance as far at the corners of the square cell as it does along linear segments, which is seen by comparing corner segments 48a, 48b, 48c and 48d of the body-drain junction with the mediate linear segments 48e, 48f, 48g and 48h. While the effect also occurs with n-type dopant, it is much less severe than the effect seen with the p-type dopant. The reason is because the n-diffusion, the second diffusion in the double diffusion process, is a rather heavy n+ type diffusion to a comparatively shallow depth on the order of from 0.5 to 1 micron. Moreover, n-type dopant tends to diffuse to about the same extent horizontally as vertically. The result is that the dopant advance at the corners is not noticeably impeded, relative to the extent that the advance of the p-type dopant is impeded, as suggested by regions 49a, 49b, 49c and 49d. While the channel 44 does tend to be shorter at the corners, the cell is still useful.

Were the channel 44 to be made generally short, the three dimensional diffusion effect likely would result in punch-through at the corners. Punch-through is a condition in which the depletion region reaches into the n+ source, thereby causing conductance through the reverse-biased device and leading to device breakdown. Punch-through would occur because the three dimensional diffusion effect would cause the channel 44 to be excessively short at the corners 48a, 48b, 48c and 48d.

Figure 5:
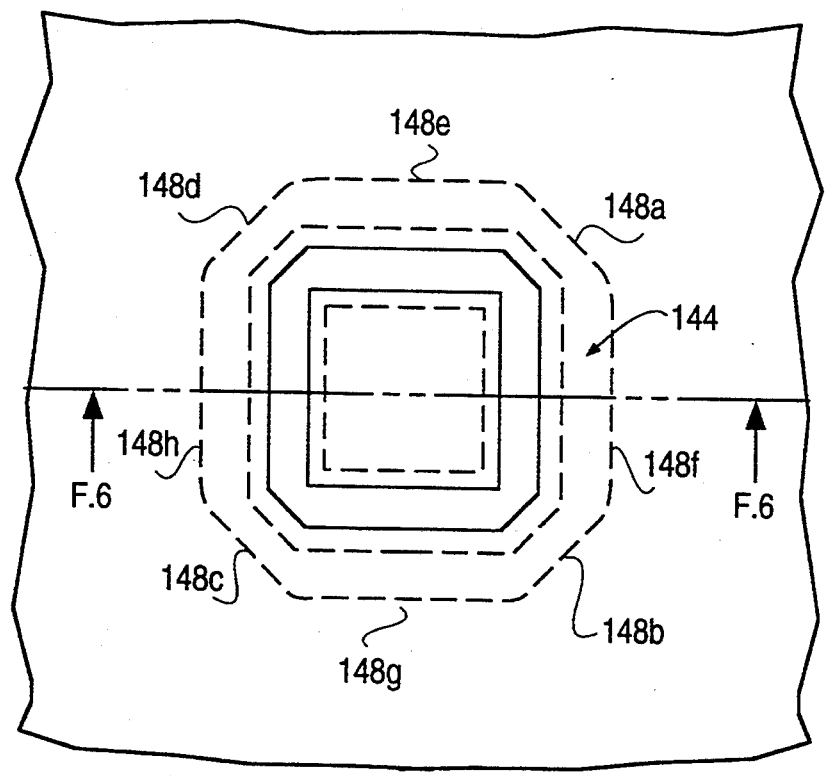
FIG. 5 is a plan view of a square cell in accordance with the present invention.
Figure 6:
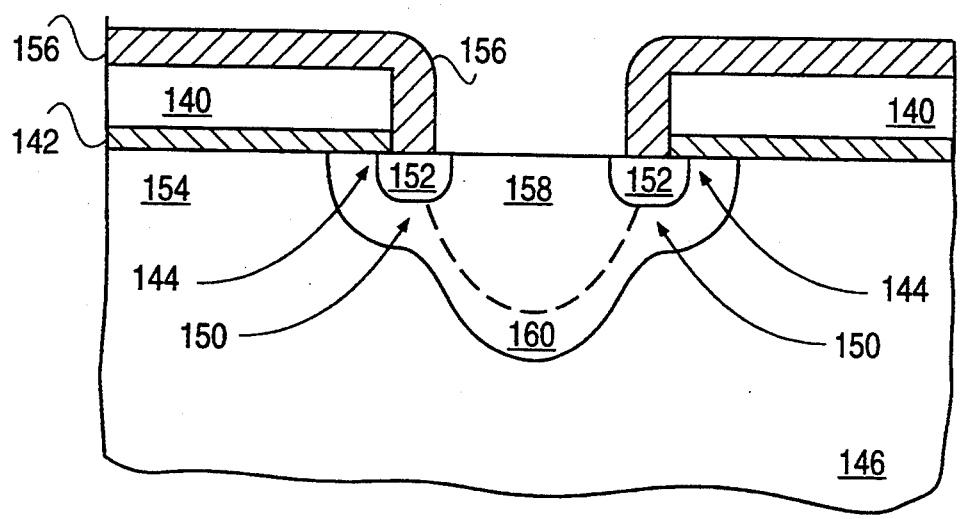
FIG. 6 is a cross sectional view of the square cell of FIG. 5.
Figure 9A:
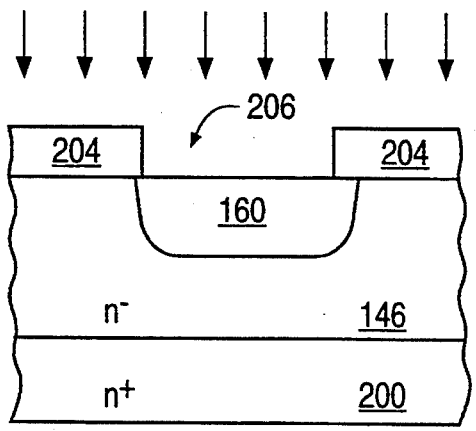
Figure 9B:
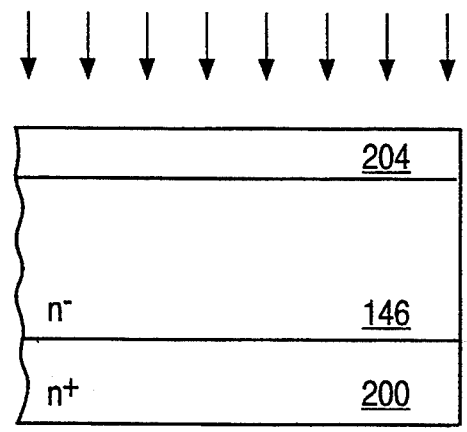

In the cell of FIGS. 5 and 6, excessive shortening of the channel 144 in the corner regions 148a, 148b, 148c and 148d is avoided by making the sharp corners blunt. In the square cell of FIGS. 5 and 6, the corners are advantageously made blunt by replacing the 90 degree corner angle in the polysilicon 140 with a short linear segment that makes a 135 degree angle with both contiguous linear segments. For example, segment 148a makes a 135 degree angle with segments 148e and 148f; segment 148b makes a 135 degree angle with segments 148f and 148g; segment 148c makes a 135 degree angle with segments 148g and 148h; and segment 148d makes a 135 degree angle with segments 148h and 148e. As the three dimensional effect is rendered less problematic at the critical corners, the diffusions are kept shallow and the length of channel 144 is brought into the range of from 0.5 to 0.75 microns, for example. Typical junction depths in this event would be about 2.5-3 microns for the p-tub 160, about 2-2.5 microns for the p+ body contact 158, about 1-1.25 microns for the p body 150, and about 0.3-0.6 microns for the n+ source region 152. Note that normally a heavily doped shallow region such as p+ body contact 158 would lower the breakdown voltage by up to 40 percent compared to earlier devices built on the same epi specifications (doping and thickness). This difficulty is overcome in accordance with the present invention by providing the lightly doped p— tub 160, which forms a linearly graded pn junction, resulting in improved breakdown voltage.

The process for forming the cell of FIGS. 5 and 6 is illustrated in FIGS. 7-17. Parts A of FIGS. 7-17 are cross-sectional views taken through a typical cell, while parts B of FIGS. 7-17 are cross-sectional views taken through the termination region at the periphery of the chip.

Suitable starting material includes an n+ doped silicon substrate 200 having a resistivity in the range of, for example, from 0.001 to 0.005 ohm-cm, supporting a n— doped epitaxial layer 146 having a resistivity of, for example, from 0.15 to 1 ohm-cm. A thermally grown field oxide 204 is grown by any suitable process such as, for example, a thermal process to a thickness in the range of, for example, 5000 to 10,000 Angstroms, as shown in FIG. 7.

Figure 10A:
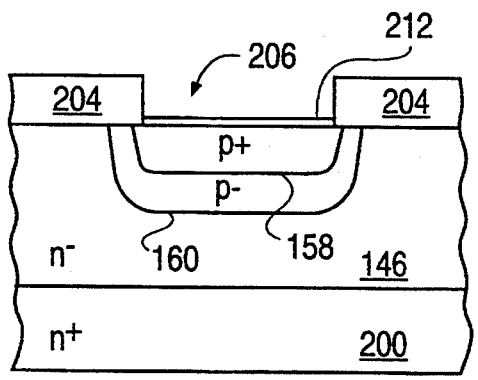
Figure 10B:
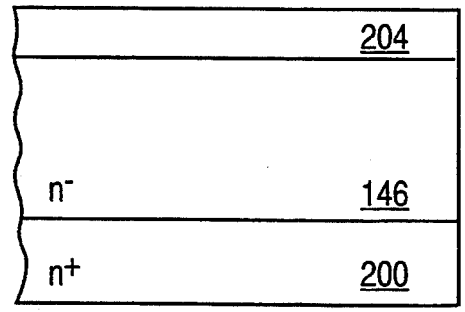

The first masking step is for the diffusion of the p— tub and the p+ body contact. A window 206 is opened in the field oxide 204 over the cell region by any suitable process such as, for example, a dry oxide etch. The resist is suitably stripped, and the p— tub implant is made (FIG. 9) with Boron at a dose in the range of 1E13-1.5E14ions/cm$^2$, at an energy in the range of 40-100 KeV. The Boron implant is diffused at a temperature of from 1000° to 1250 degrees C for 2-10 hours using any suitable oven to form the p— tub 160. A wet etch in a suitable HF solution is carried out to remove any resulting oxide, and the p+ body contact is formed by injecting Boron from a boron nitride source in any suitable furnace through the window 206 at 750-1000 degrees C. A Boron rich glass 212 forms in the window 206 during the injection. A Boron soak is carried out in any suitable oven at 750-1000 degrees C for from 15 minutes to 3 hours, as appropriate, wherein boron from the glass continues to diffuse into the epitaxial silicon to form p+ body contact 158 in the p− tub 160 (FIG. 10). The sheet resistance of the p+ body contact is 10-100 ohms/square.

Figure 11A:
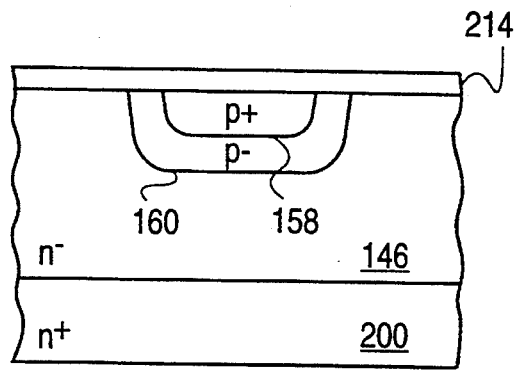
Figure 11B:
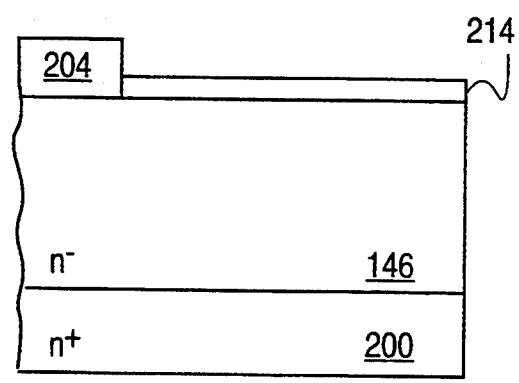
Figure 12A:
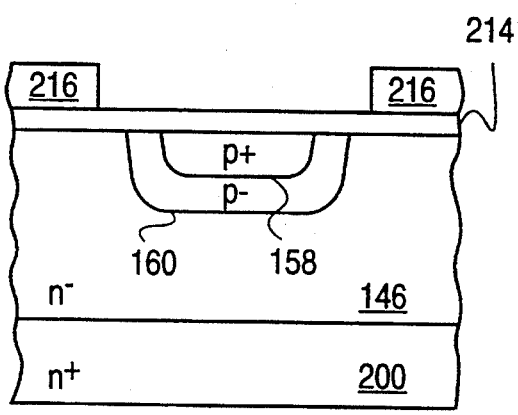
Figure 12B:
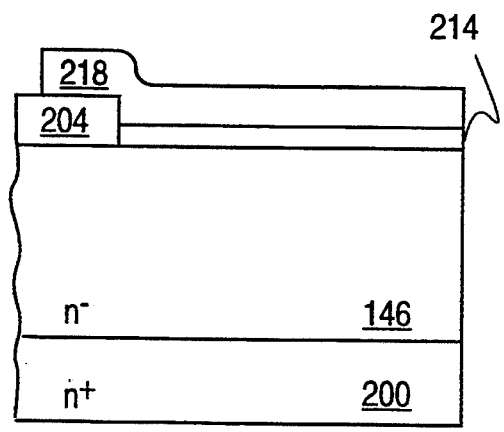

In a second masking step, the field oxide 204 is protected in the peripheral termination region, including gate finger regions. All oxide is removed from the active device areas, and gate oxide 214 is thermally grown at 900-1100 degrees C for 20 minutes to 3 hours, as desired (FIG. 11).

Figure 13A:
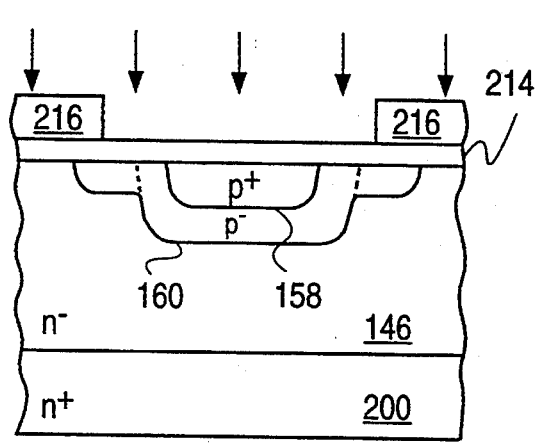
Figure 13B:
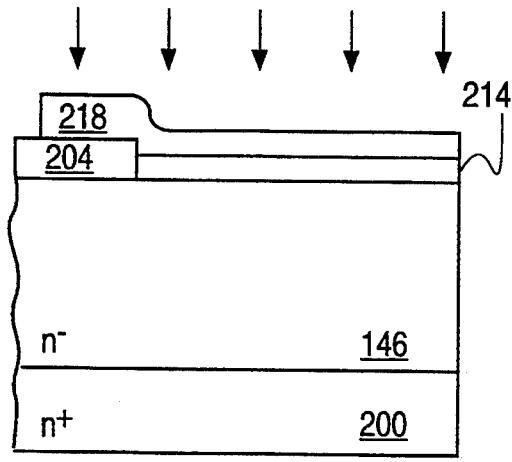

A polysilicon film is deposited to a thickness of 0.3-0.7 microns using any suitable equipment. A polysilicon film also is deposited on the backside, and is removed along with an underlying oxide in a wet oxide etch for the purpose of exposing the wafer backside to heavy diffusion using phosphorus or other suitable dopant. The polysilicon film is then doped to less than about 20 ohm/square, and is patterned in a third masking step for opening windows to form p− body, n+ source regions, and ultimately metal contacts to the source and body. The polysilicon film is etched in any suitable equipment to form gate poly 216 and periphery strip 218, a component of a termination structure. The resist is stripped, and Boron is implanted at a dose of 5E1-3−2E14 ions/cm$^2$ and an energy of 40-100 KeV in any suitable equipment (FIG. 13). The Boron is diffused at 900-1200 degrees C. for 10 minutes to 5 hours, as desired. The purpose of this diffusion is to form the double diffused channel 144 as shown in FIGS. 5 and 6.

Figure 14A:
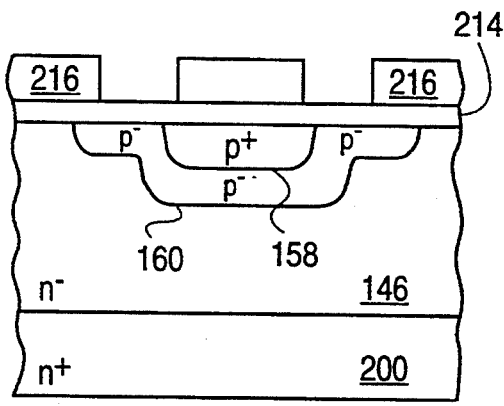
Figure 14B:
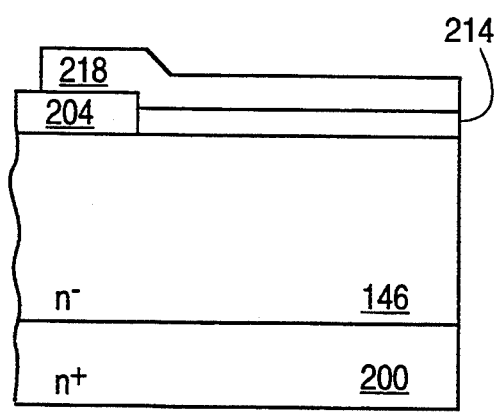
Figure 15B:
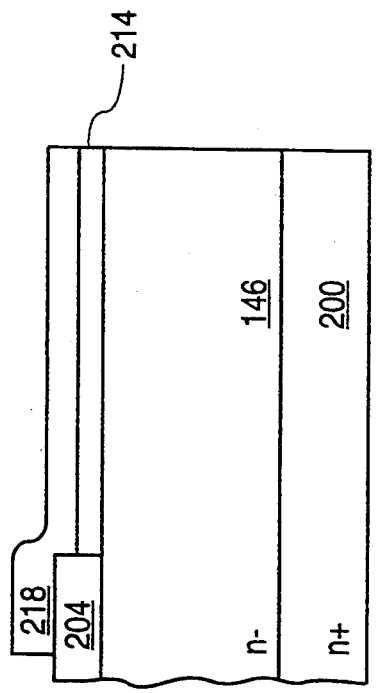
Figure 15A:
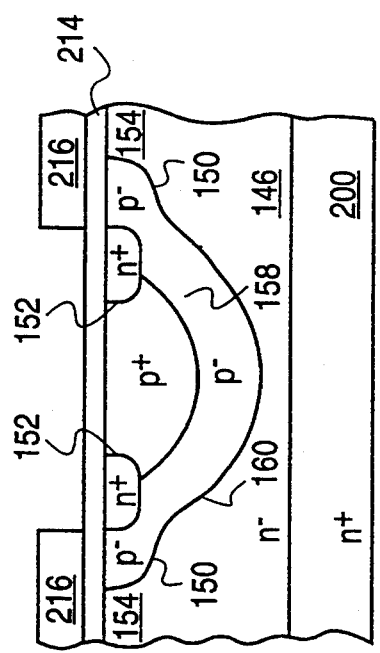
Figure 16B:
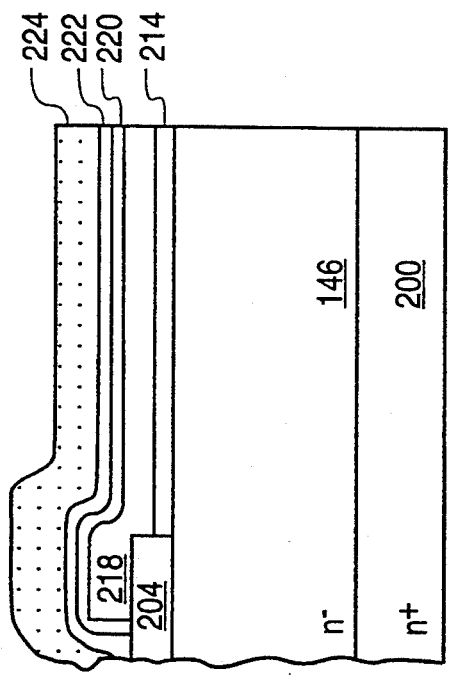
Figure 16A:
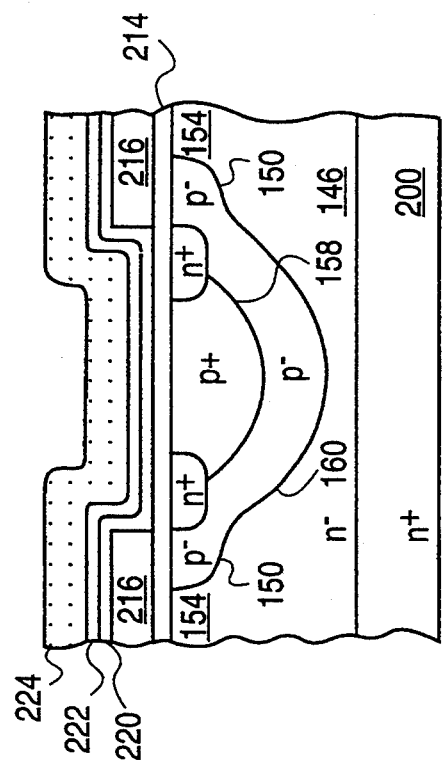

Oxide is etched from the p− body diffusion region using either a dry or wet etch, as desired, and a layer of suitable photoresist is deposited and patterned in a fourth masking step to form a source mask (FIG. 14). An Arsenic implant is made using a dose of 1E15-1E1-6 ions/cm$^2$ at an energy of 60-120 KeV, after which the resist is stripped (FIG. 15) and the Arsenic diffused at 850-1100 degrees C. for 0.5-1 hour to form the annular square source region 152 with blunted corners. An oxide layer 220 forms during the Arsenic diffusion (FIG. 16). The annular square channel 144 with blunted corners is defined in the body 158 between the source region 152 and the drain 154 again see FIGS. 5 and 6. At this point, the junction profile of the cell is essentially established.

Figure 17B:
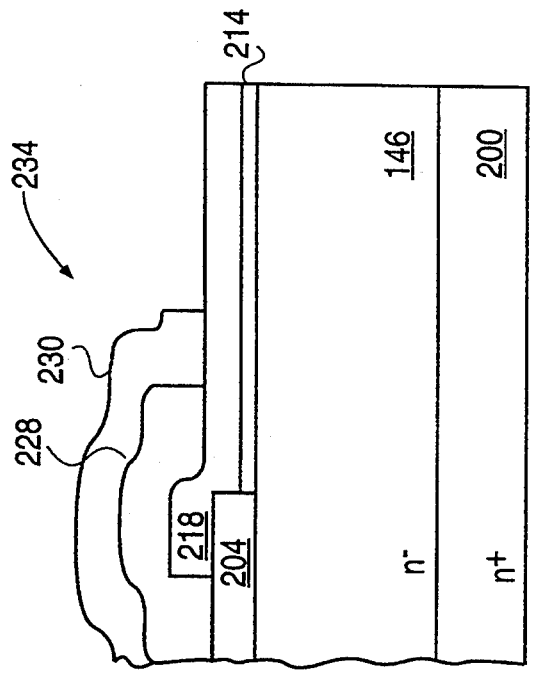
Figure 17A:
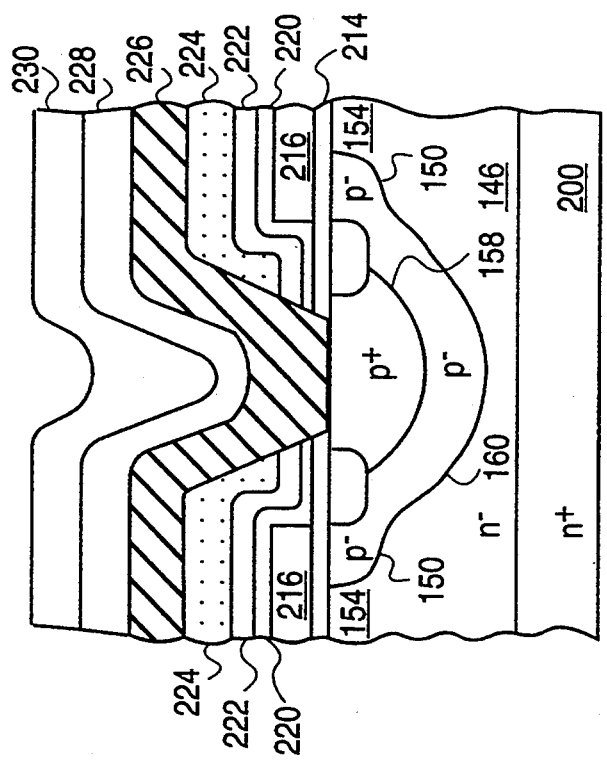

The device is completed by depositing (optionally) about 1000 Angstroms of LPCVD nitride 222 followed by a BPSG deposition of about 0.8-1.3 microns and a BPSG reflow 224 at about 850-1000 degrees C. (FIG. 16). The fifth masking step is a contact mask, which defines the source-body contact and the poly gate contact. The BPSG layer 224, the nitride layer 222, and the oxide layer 220 are suitably etched in a sequence involving, for example, a descum, a dry etch in suitable equipment, and a resist strip, followed by a reflow of the BPSG at 850-1100 degrees C. for 10-30 minutes (FIG. 17). A suitable metal such as aluminum or a material such as aluminum with 1 percent silicon is deposited using, for example, sputter deposition, and is suitably patterned in a sixth masking step and etched to form the source electrode 226, the gate electrode (not shown), and termination field plates (not shown). Films of PSG 228 and/or plasma nitride 230 are deposited, pad contact holes are opened in a seventh masking step, and an alloy step is performed at 300-450 degrees C in an inert ambient.

The termination structure 234 comprising field oxide 204, gate oxide 214, and polysilicon periphery strip 218 need only be coupled electrostatically to the epitaxial silicon 146 in order to function satisfactorily. The coupling is achieved when the die is separated from the wafer by dicing, since the thin gate oxide 214 near the die edge is damaged and becomes leaky. The termination structure 234 assumes the voltage level of the epitaxial layer 146, and at this potential acts to exclude the depletion region from the leaky damaged silicon at the die edge.

Figure 18A:
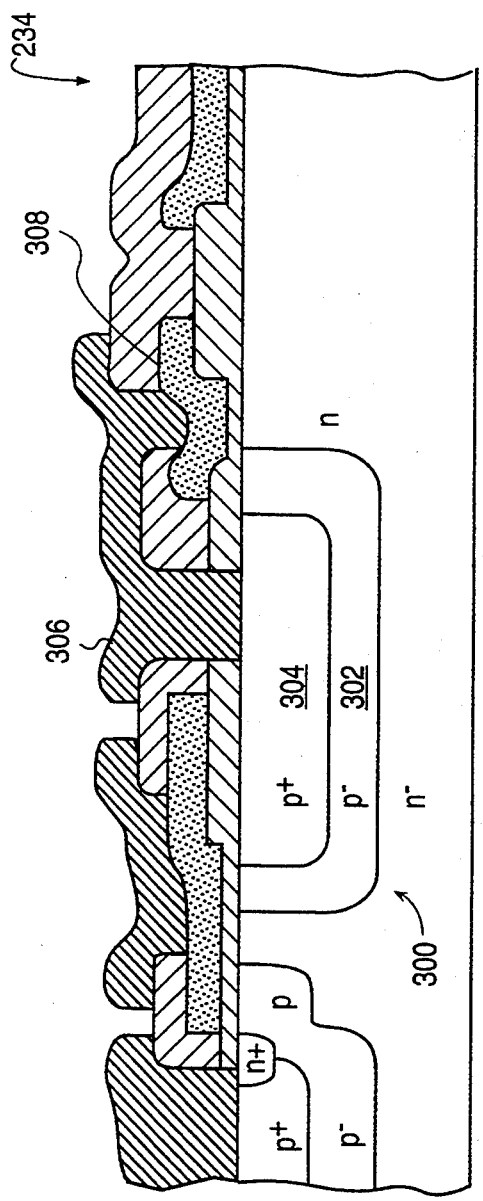
FIG. 18A is a cross-sectional view of the periphery of one embodiment of a power MOSFET device in accordance with the present invention.
Figure 18B:
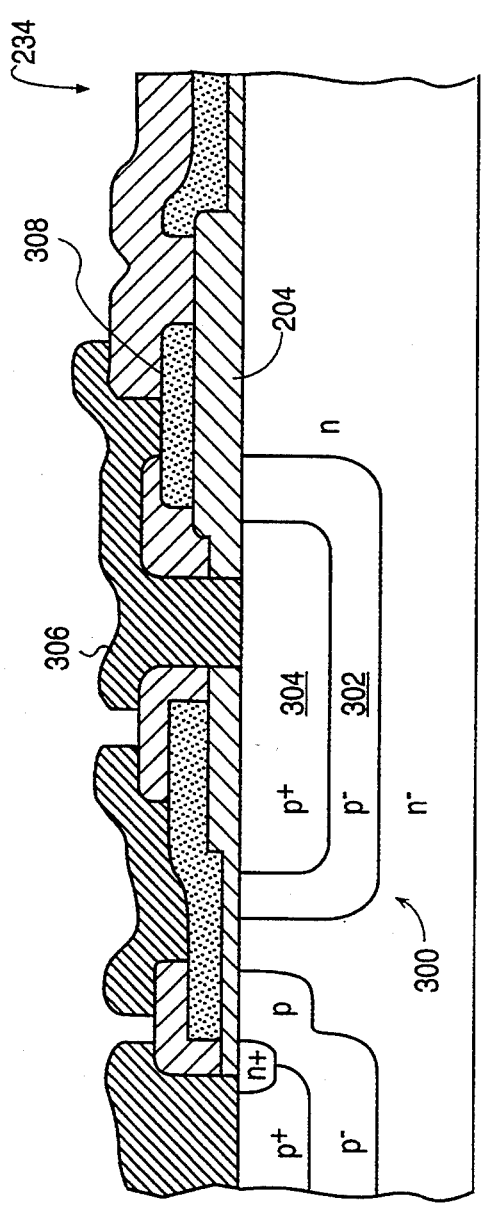
FIG. 18B is a cross-sectional view of the periphery of a second embodiment of a power MOSFET device in accordance with the present invention.

FIG. 18A shows one embodiment of the full termination structure 234, including a typical inactive cell 300. The inactive cell 300 is similar to the active cells except no channel region is provided, although a p− tub 302 and p+ body contact 304 are provided. Source metal 306 shorts a polysilicon ring 308 and the inactive cell 300 to the source electrode. FIG. 18B shows another embodiment of the full termination structure 234 wherein all portions of polysilicon ring 308 are separated from the underlying semiconductor body by field oxide 204.

Figure 19:
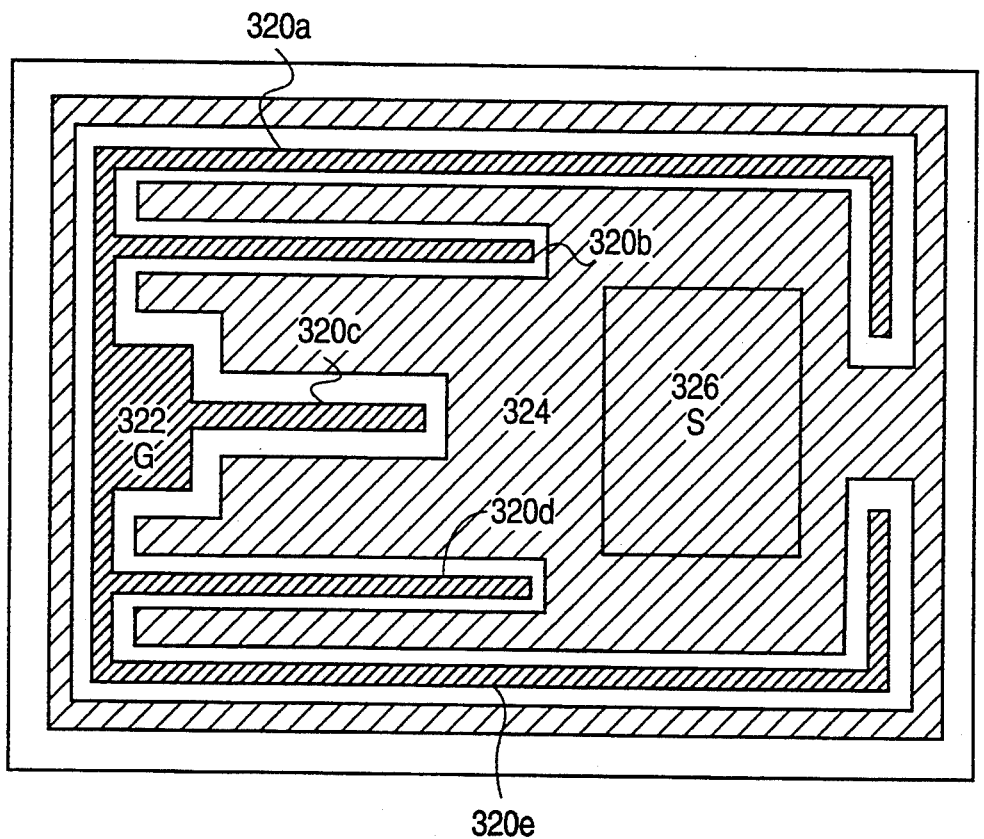
FIGS. 19–20 are plan views of a completed power MOSFET device, in accordance with the present invention.
Figure 20:
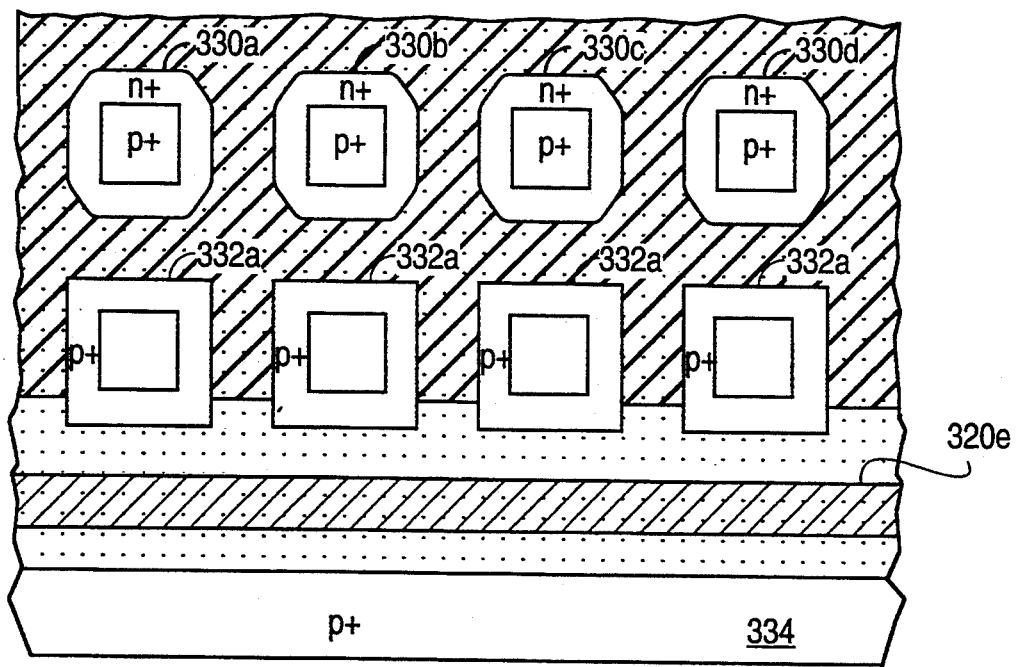

FIG. 19 shows a plan view of a completed device with the gate fingers 320a-320e, gate bonding pad 322, source metal 324, and source bonding pad 326. The exploded view of FIG. 20 shows the juxtaposition of the active cells 330a-330d (other active cells in the device are not shown), the inactive cells 332a-332d (other inactive cells in the device are not shown), the gate finger 320e, and the p+ polysilicon ring 334.

These techniques have been used to achieve a specific on-resistance of 1.65 milliohms-cm$^2$ for 60 volt devices, and 0.85 milliohms-cm$^2$ for 30 volt devices.

As will be recognized, six masking steps are utilized in an alternative of the fabrication process described in FIGS. 7A-20 of the present invention. These six masking steps are as follows:
1) a deep P+ masking step in which an opening is formed in layer 204 as shown in FIG. 8A through which a P+ implant is performed;
2) a masking step in which a portion of photoresist is formed to protect and thereby to form the portion of oxide layer 204 shown in FIG. 11B;
3) a polysilicon masking step in which portions of photoresist are used to protect and thereby to form the portions of polysilicon layers 216 and 218 shown in FIGS. 12A and 12B;
4) BPSG contact masking step in which portions of a layer 224 are removed to form a contact to P+ region 158 of FIG. 17A, to form a contact to P+ region 304 of FIG. 18A, and to form a contact to poly region 308 of FIG. 18A;
5) a metal masking step in which portions of a metal layer 226 are removed to form the metal source electrode 226 of FIG. 17A, the metal gate finger of FIG. 18A, and the termination metal 306 of FIG. 18A; and
6) a pad masking step in which portions of layer 228 and/or 230 are removed to expose portions of gate bonding pad 322 and source bonding pad 326 of FIG. 19.

Another embodiment of the present invention will now be described. This embodiment, hereafter referred to as one embodiment of a five masking step process, requires only five masking steps to fabricate a DMOSFET device, such as a vertical DMOSFET, and an associated termination structure. FIGS. 21A-21M show various stages in the fabrication of a DMOSFET device and an associated termination structure in accordance with this embodiment.

Figure 21A:
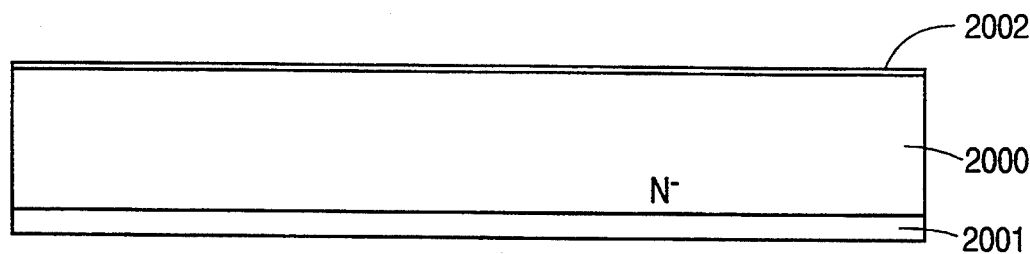
FIGS. 21A–21M show various stages in the fabrication of a DMOSFET device and an associated termination structure in accordance with a first embodiment of a five masking step embodiment of the present invention.
Figure 21B:
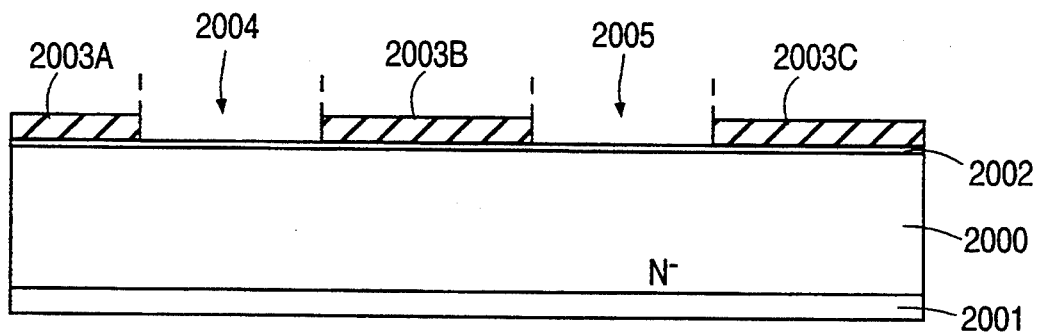

As shown in FIG. 21A, a relatively lightly doped N— epitaxial layer 2000 is formed on a relatively highly doped N+ substrate 2001. Epitaxial layer 2000 may, for example, be 5-10 μm thick and have a doping concentration of 2E16-4E16 atoms/cm$^3$. Although substrate 2001 is actually a thick substrate of approximately 500 μm, substrate 2001 is represented here in condensed fashion to facilitate the illustration. A thin gate oxide 2002 is then formed on the top surface of the epitaxial layer 2002. The gate oxide 2000 may, for example, be 500 Angstroms thick.

A layer of polysilicon is then formed on the thin oxide layer. In a first masking step, a polysilicon masking step, portions of this polysilicon layer are anisotropically etched leaving portions 2003A, 2003B and 2003C of the polysilicon layer and also leaving selected portions of the underlying thin oxide 2002 exposed. See FIG. 21B. This layer of polysilicon may, for example, be 4000-5000 Angstroms thick. Accordingly, an opening 2004 is formed in the active area through which a device will be formed. Another opening 2005 is also formed in the termination region.

Figure 21C:
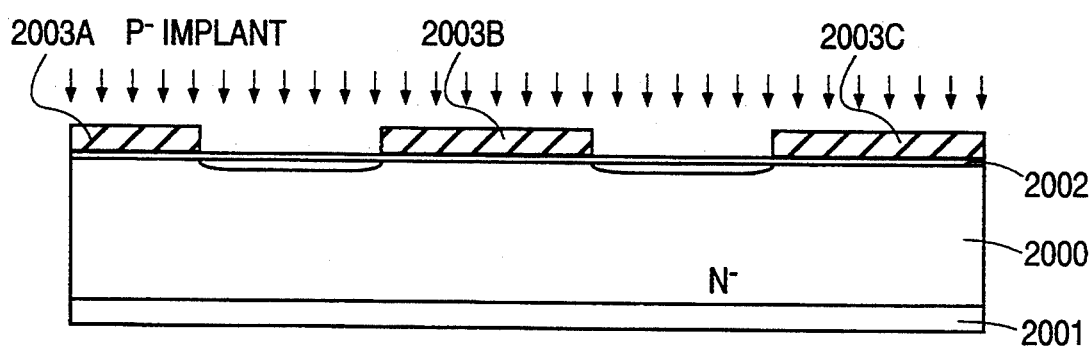

As shown in FIG. 21C, a P— body implant step is then performed through the thin oxide 2002 in the openings 2004 and 2005. The remaining portions of polysilicon 2003A, 2003B, and 2003C act as an implant mask. This implant may, for example, be a 60 KeV implant of Boron which is performed until the implanted areas are implanted with a dose of 1E13-2E14 ions/cm$^2$.

Figure 21D:
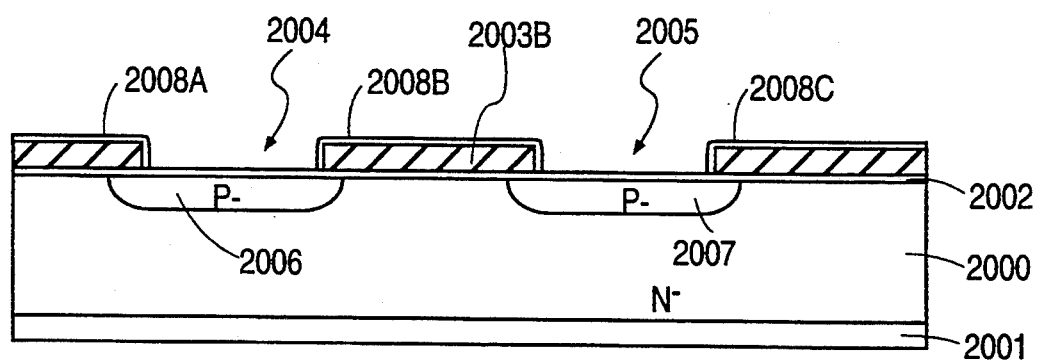

As shown in FIG. 21D, the implanted P ions are then thermally diffused deeper into the epitaxial layer 2000. This thermal diffusion may take place at 1050° C.-1200° C. for about 30 minutes to 2 hours until the ions have diffused 1-2 μm into the epitaxial layer. The implanted ions also diffuse laterally, for example 0.8-1.6 μm, underneath part of the remaining portions of polysilicon 2003A-2003C. The diffused implanted P ions therefore form a deep P— region 2006 and a P— type ring region 2007. The ring region 2007 surrounds the entire active area of the semiconductor substrate. In an alternative structure, a P— region is formed as one of a plurality of inactive cells. Such inactive cells are disposed as a row disposed between the active cells in the active area of the device and the polysilicon ring 2003C which substantially surrounds the active area. In this configuration, the row of inactive cells is disposed to be substantially parallel to the polysilicon ring. Regardless of which structure is to be employed, however, regions of an oxide 2008A, 2008B and 2008C are also formed during the diffusion step on the exposed top and side surfaces of the polysilicon regions 2003A, 2003B and 2003C.

Figure 21E:
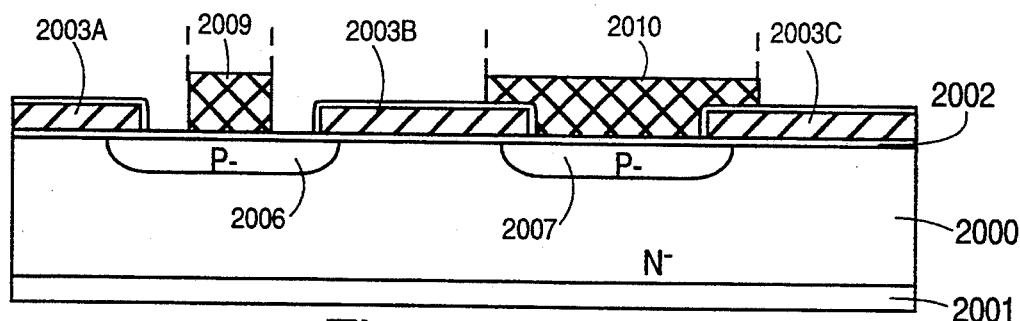

As shown in FIG. 21E, a layer of positive photoresist is formed and subsequently masked in a second masking step to form localized blocking areas of thick photoresist. This photoresist may, for example, be 1.5 μm thick. In the active area, a block of photoresist 2009 is thereby formed in each of the openings 2004 in the active area through which the P— body implant was formed. In the termination area, a block of photoresist 2010 is formed to cover completely the opening 2005 in the polysilicon. The block of photoresist 2010 in the termination area also extends laterally beyond the lateral boundary of opening 2005 over at least a portion of the polysilicon regions 2003B and 2003C so that misalignment of the photoresist mask to the left or right in FIGS. 21E and 21F will not result in any part of the P— region 2007 being exposed.

Figure 21F:
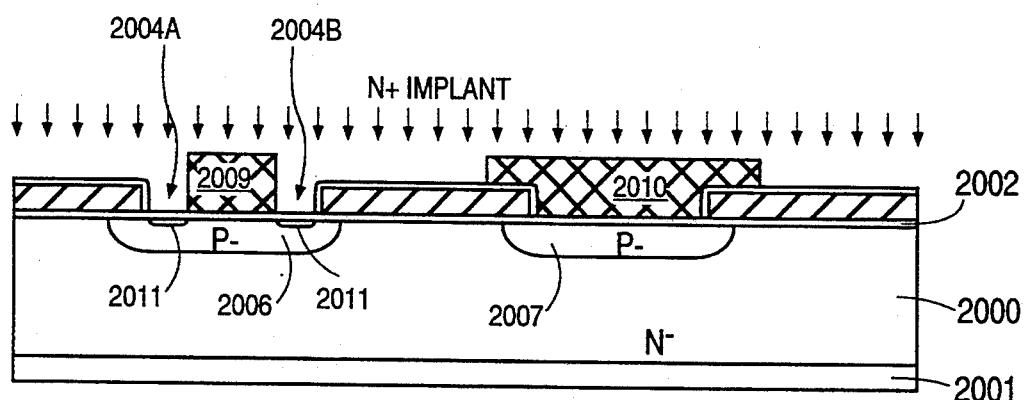

As shown in FIG. 21F, a subsequent N+ implant step is performed. This implant step may, for example, be an Arsenic implant performed at 80-150 KeV until the dose reaches 5E15-8E15 ions/cm$^2$. N+ regions 2011 are therefore formed under annular openings 2004A about mask 2009 in the active area. Each of the N+ regions 2011 is formed about a photoresist block 2009 so that the N+ regions may each have an annular shape when viewed from the top. The outer and/or inner boundary of this annular shape may, for example, be a polygon such as a hexagon, a square, an octagon, a long strip-like rectangular shape, a triangle, et cetera. In some embodiments, the inner and outer boundaries of the annular-shaped N+ regions may have different geometrical shapes when viewed from the top. No N+ region is formed in the opening 2005 in the termination region due to photoresist block 2010 covering the entire surface of oxide 2002 in this opening.

Figure 21G:
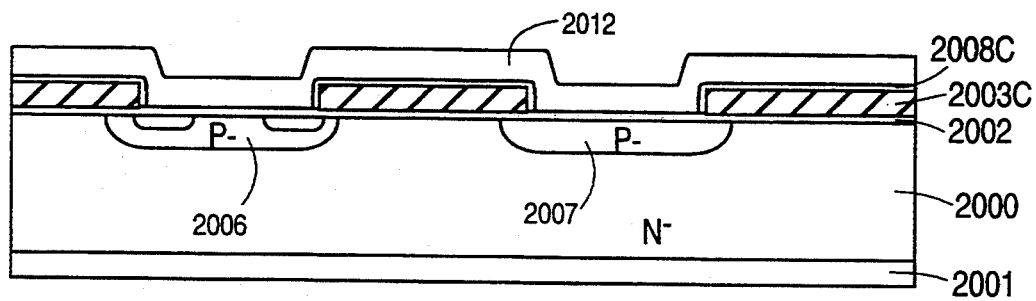

As shown in FIG. 21G, the photoresist blocks 2009 and 2010 are removed. The N+ regions 2011 are then thermally diffused laterally and vertically into the deep P— region 2006 in the active area. This thermal diffusion may, for example, be performed at 900°-1000° C. for 30 minutes to one hour until regions 2011 have diffused vertically 0.3-0.7 μm. After this diffusion step, a layer 2012 of Boron Phosphorus silicate Glass (BPSG) is deposited and reflowed over the structure as depicted in FIG. 21G. This BPSG may, for example, be 1.2-1.4 μm thick.

Figure 21H:
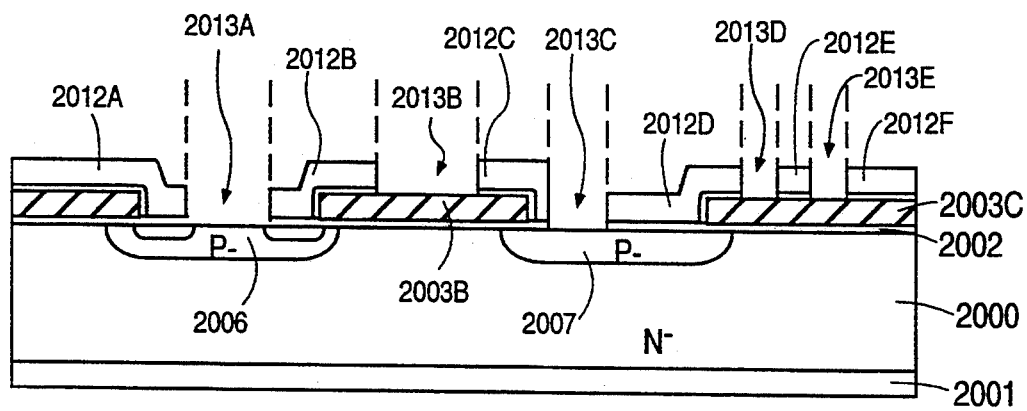

As shown in FIG. 21H, a third masking step is then performed to form openings 2013A-2013E in the BPSG layer 2012 to leave BPSG portions 2012A-2012F. Opening 2013A is formed over a portion of the surface area which was covered by photoresist block 2009 so that only an inside annular portion of annular region 2011 is exposed. Opening 2013C is formed over a portion of the surface area which was covered by photoresist block 2010 so that BPSG region 2012D extends over a portion of oxide layer 2002 inside opening 2005 and so that BPSG region 2012D also extends up and over a part of polysilicon region 2003C. As shown in FIG. 21H, openings 2013A and 2013C extend through both the BPSG layer 2012 and also through the underlying oxide layer 2002 to the top surface of the epitaxial layer 2000. Opening 2013B extends through both BPSG layer 2012 and also through oxide layer 2008B to extend down to the top of polysilicon layer 2003B. Openings 2013D and 2013E extend through both the BPSG layer 2012 and also through the oxide layer 2008C to extend down to the top of polysilicon layer 2003C in the termination region.

Figure 21I:
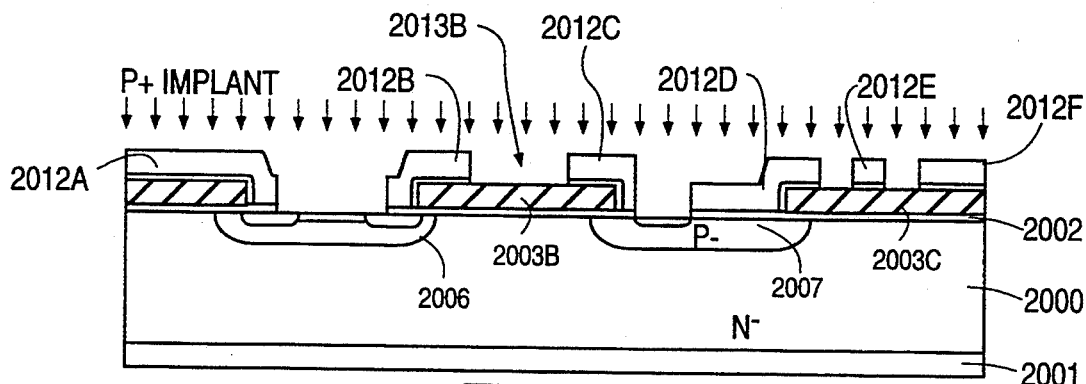

As shown in FIG. 21I, a P+ implant step is then performed to implant P ions in P— region 2006 of the active region and to implant P ions in P— region 2007 in the termination region. This implant may, for example, be a Boron implant performed at 40-60 KeV until the doses in regions 2006 and 2007 reach 1E14-1E15 ions/cm$^2$. These P+ regions are formed in regions 2006 and 2007 to provide better surface contact to a subsequently added metal electrode.

Figure 21J:
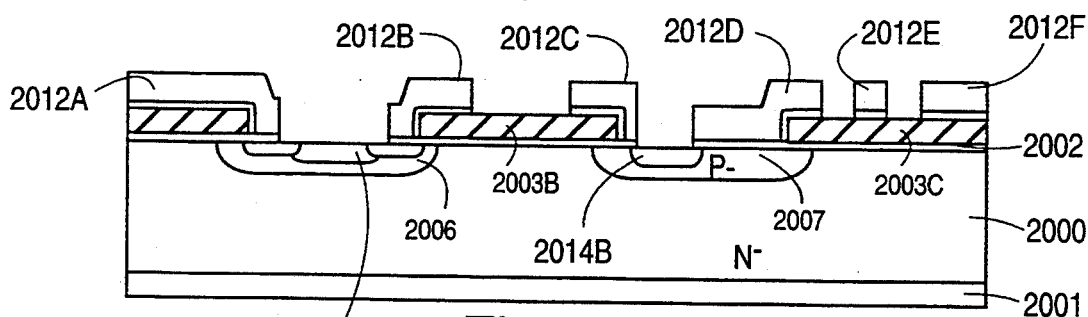

As shown in FIG. 21J, the implanted P ions are then thermally diffused down into the regions 2006 and 2007 to form P+ region 2014A in P− region 2006 and to form P+ region 2014B in P− region 2007. This thermal diffusion may, for example, be performed at 900° C.–950° C. for 30 minutes to an hour. The BPSG is simultaneously reflowed to remove abrupt edges of the BPSG which may have been formed when openings 2013A–2013E were formed in the BPSG. This reflow allows better metal step coverage in the final structure. In some embodiments a rapid thermal annealing step may be used to cause the P ions to diffuse into regions 2006 and 2007.

Figure 21K:
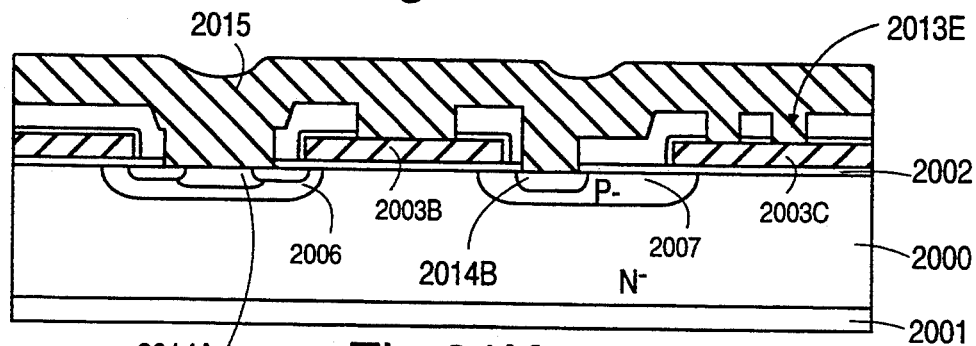

As shown in FIG. 21K, a layer 2015 of metal such as a 2-3 μm thick layer of Aluminum is then sputtered over the top surface of the structure to extend down into openings 2013A–2013E in the BPSG layer. Accordingly, metal layer 2015 contacts P+ regions 2014A and 2014B through holes 2013A and 2013C, respectively. Metal layer 2015 contacts polysilicon region 2003B through opening 2013B. Metal layer 2015 also contacts polysilicon region 2003C in the termination region at two places through openings 2013D and 2013E, respectively.

Figure 21L:
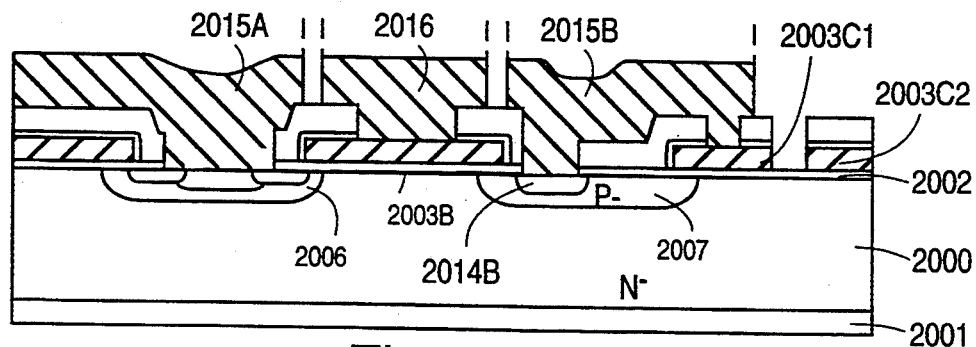

As shown in FIG. 21L, a fourth masking step, a metal mask is then performed to wet etch away selected portions of the metal layer 2015 to form source metal electrode 2015A, metal gate finger electrode 2016, and termination metal 2015B. Note, as indicated below, that electrodes 2015A and 2015B are continuous with each other and thereby form a composite source electrode. During this step, the metal in opening 2013E is etched out to expose the top surface of the polysilicon layer 2003C at the bottom of opening 2013E. Because metal is usually doped to contain small amounts of silicon, silicon residue remains after a doped metal is etched in an etching step. Accordingly, a defreckle etch may be subsequently performed to remove this silicon residue.

In the present invention, a subsequent defreckle etch not only removes silicon residue left after the metal is removed, but also serves to etch an opening through polysilicon layer 2003C where polysilicon layer 2003C is left exposed by opening 2013E in the BPSG layer. As a result, opening 2013E extends down to the top surface of thin oxide layer 2002 overlying epitaxial layer 2000. A first polysilicon feature 2003C1 and a second polysilicon feature 2003C2 are therefore formed from the original polysilicon layer 2003C.

After the metal etch, a passivation layer 2018 is disposed over the entire on the upper surface of the substrate. The bottom surface of the substrate is then "backlapped" or ground down until the substrate has a thickness of approximately 10–18 mils. A metal drain 2017 is then sputtered onto the ground bottom surface of N+ silicon substrate 2001.

A fifth and final masking step, a pad masking step, is performed. In this step, openings are formed through the passivation layer 2018 to reach down to a metal gate pad and a metal source pad. These gate and source pads are not in the plane of FIG. 21M so FIG. 21M does not show the openings in the passivation.

Figure 22A:
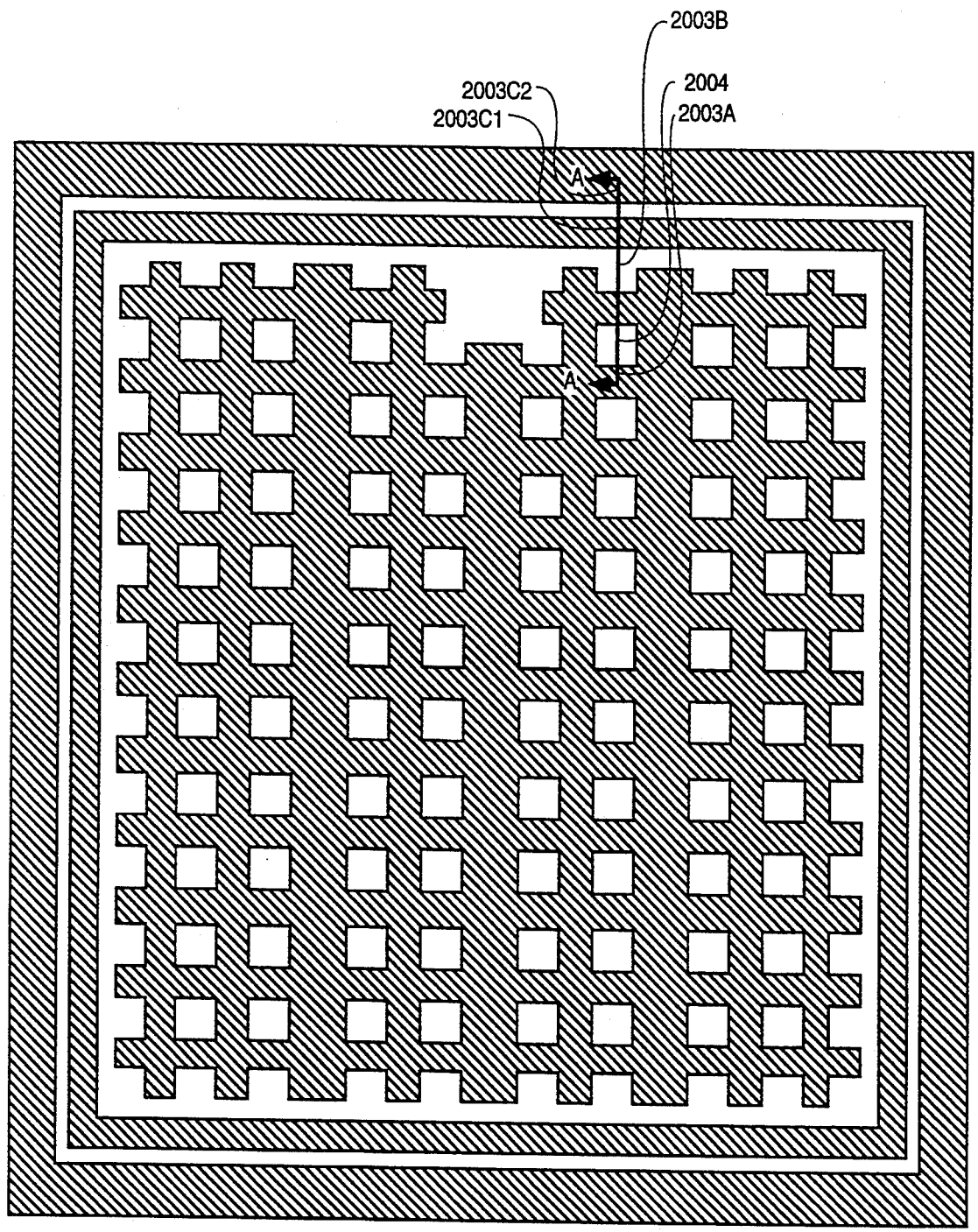
FIG. 22A is a top down view of one layout of the polysilicon layer of the five masking step embodiment of the present invention.

FIG. 22A is a top down view depicting one possible layout of the polysilicon layer of the present invention. This particular layout with a relatively small number of openings 2004 in the active area is provided for explanatory purposes. Other configurations of gate finger electrodes, gate pads, source pads, and polysilicon layers are possible. Cross-sectional views 21A–21M are taken along line A—A of FIG. 22A.

Figure 22B:
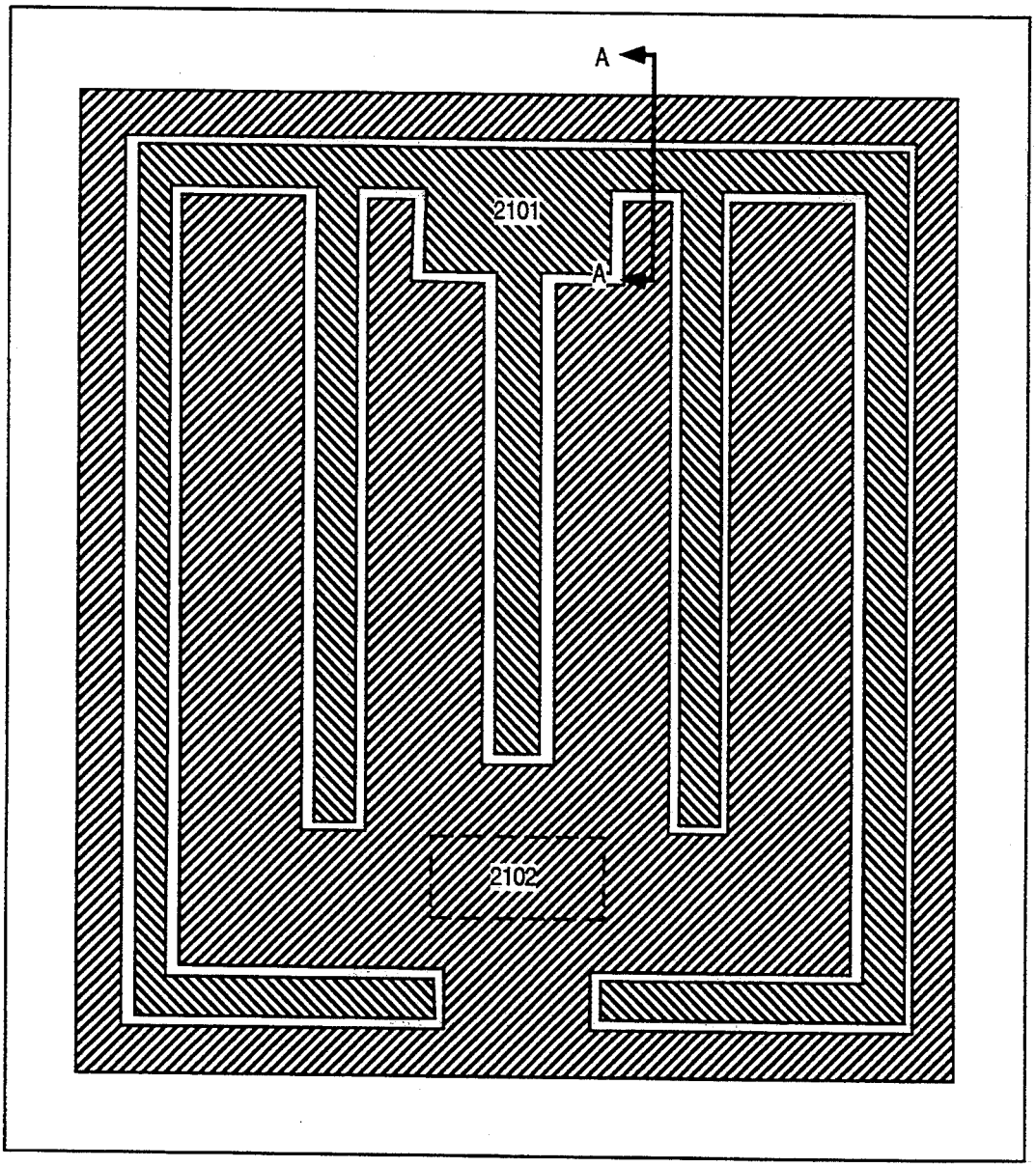
FIG. 22B is a top down view of one layout of the source metal electrode and the gate finger metal electrode of the five masking step embodiment of the present invention.

FIG. 22B is a top down view depicting the gate finger electrode 2016 and the composite source metal electrode 2015A, 2015B. Rectangular pad 2101 is a metal gate pad and rectangular pad 2102 is a metal source pad.

High voltage DMOSFET devices must be able to survive conditions of high reverse bias. Under conditions of reverse bias, the PN junction formed between the P well of the active device and the N material of the epitaxial layer depletes. As the PN junction depletes more and more at higher and higher reverse biases, the depletion region extends farther and farther away from the junction. If the depletion region has a smooth and continuous surface, a substantially constant electric field will be present throughout the surface of the depletion region. If, on the other hand, the depletion region has a nonuniform surface, localized areas of higher electric field will be present. Accordingly, it is seen that the silicon in the depletion region will break down first in these localized area of relatively higher electric fields. Field plates are therefore used in termination areas to influence the electric fields in the underlying substrate so that the contours of the surface of the depletion region will be smoother and so that the reverse bias voltage at which the device breaks down will be higher.

In the above described embodiment of the five step process, polysilicon layer 2003C1 is electrically connected to P+ region 2014B. P− structure 2007, P+ structure 2014B, metal connection 2015B, and polysilicon layer 2003C1 form a termination field plate. Polysilicon layer 2003C1 of the field plate is insulated from the underlying epitaxial layer by thin oxide layer 2002. In conditions of high reverse bias, the depletion region forms along the upper surface of the epitaxial layer due to the influence of the overlying polysilicon layer 2003C1.

Figure 23A:
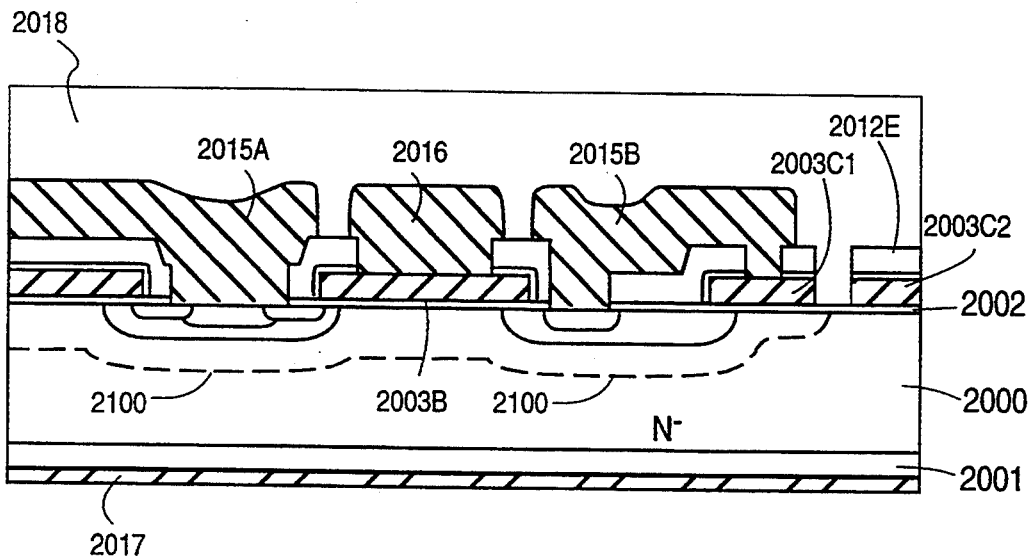
FIG. 23A is a cross sectional diagram showing the outer contours of the depletion region in a termination structure of the present invention with a field plate in a reverse bias condition.
Figure 23B:
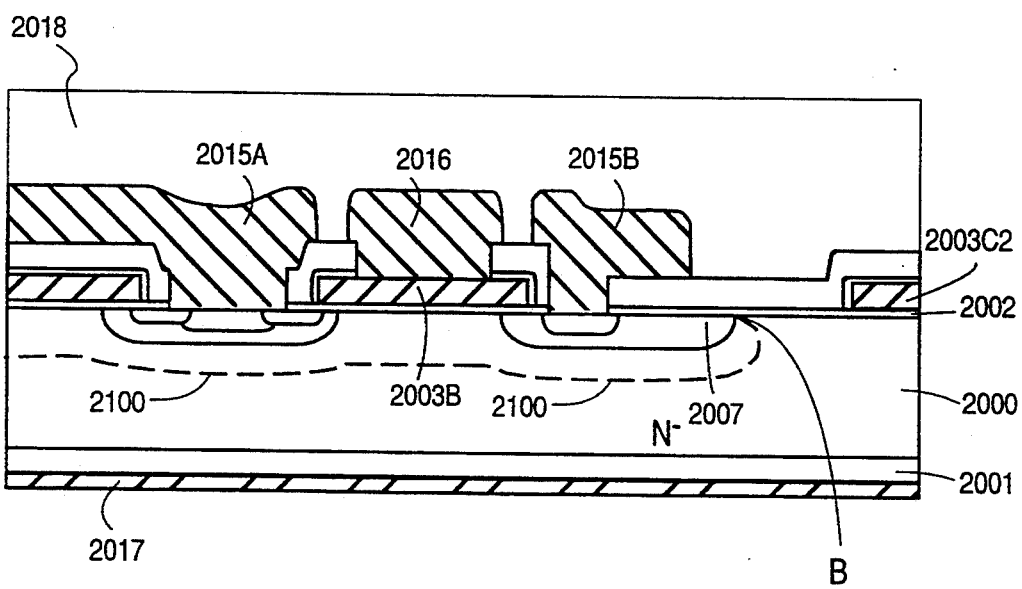
FIG. 23B is a cross sectional diagram showing the outer contours of the depletion region in a termination structure wherein a field plate is not used.

FIG. 23A shows the outline of the outer contour 2100 of the depletion region in conditions of high reverse bias, where the voltage between the drain and the source, $V_{DS}$, is approximately 20 volts, and where the voltage between the gate and source, $V_{GS}$, is approximately 20 volts. FIG. 23B shows what the outer contour of the depletion region 2100 would have been in approximately the same conditions of high reverse bias if polysilicon layer 2003C1 in the embodiment of the five step process were not present. The area of localized high electric field at which the device of FIG. 23B would most likely break down is the point B in FIG. 23B where the P− region 2007 reaches the top surface of the epitaxial layer 2000 of thin oxide layer 2002. In FIG. 23A, note that the polysilicon field ring 2003C1 smooths out the contour of the depletion region to eliminate the relatively sharp discontinuity of the depletion region at point B.

The breakdown voltage of the resulting vertical DMOSFET device can be measured between the source electrode 2015A and the drain electrode 2017. When a large negative voltage is placed across the device, that negative voltage is present between termination metal 2015B (which is electrically connected to source metal electrode 2015A outside the plane of the cross sectional view of FIG. 23A) and drain metal 2017 on the bottom side of the substrate. Because both the oxide layer 2002 and the underlying depletion region have capacitances, the large negative voltage across the device will be dropped in part across the oxide layer 2002 underneath polysilicon layer 2003C1 and in part across the depletion region in the underlying silicon. Oxide layer 2002 therefore need not necessarily be able to withstand the full negative voltage in order not to breakdown and in order to perform its function satisfactorily.

In the described embodiment of the five step process, oxide layer 2002 is approximately 500 Angstroms thick and will undergo dielectric breakdown when approximately 35 volts is present across the oxide. The breakdown voltage of the vertical DMOSFET device is approximately 40 volts. In embodiments where the dielectric breakdown requirements on the oxide 2002 can be met with a relatively thin oxide layer, the above described embodiment of the five step process can be used and the step of forming the thick oxide 204 of the above described process of FIGS. 7A-20 need not be used. As a result, at least one masking step may be saved.

If, on the other hand, a thicker oxide layer is required between the polysilicon of the field plate and the top of the epitaxial layer, the thick oxide of the process of FIGS. 7A-20 may be used. The process of FIGS. 7A-20 utilizes a thick oxide of approximately 4000 Angstroms to separate the polysilicon layer 308 from the underlying epitaxial layer. FIGS. 18A and 18B show two embodiments of a termination structure with such a thick oxide. As a result, the dielectric breakdown of the oxide layer 204 is about 320 volts and the vertical DMOSFET device of FIGS. 7A-20 has a reverse breakdown voltage of approximately 60 volts. It is to be understood, however, that the thicknesses of the oxides in both the described embodiment of the five masking step process and also in the previously described process of FIGS. 7A-20 need not have any specific thicknesses.

Figure 21M:
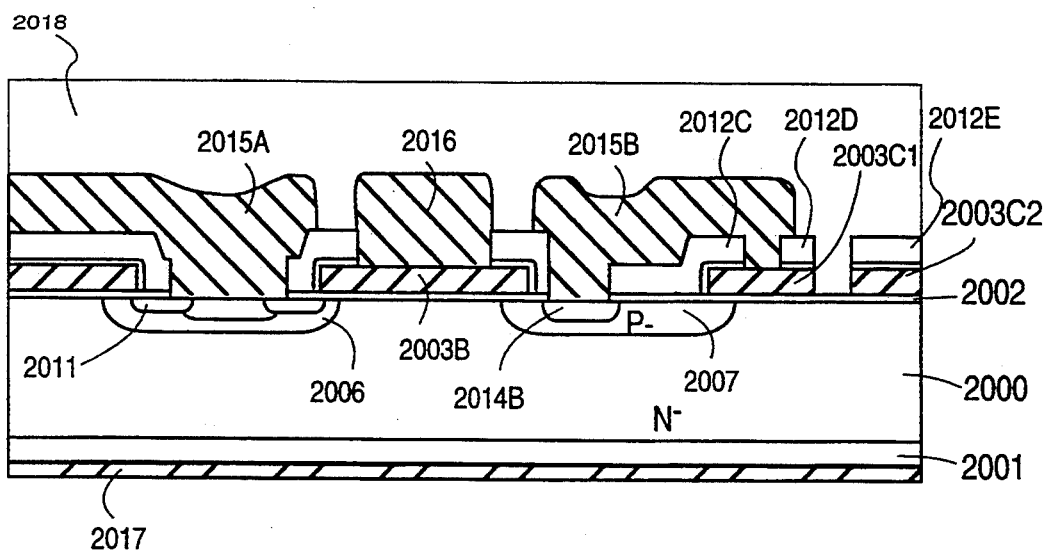

In the five masking step embodiment shown in FIG. 21M, the polysilicon layer 2003C2 disposed in the termination region is used in part as a mask to mask the underlying surface of the epitaxial layer 2000 in a scribe line portion of the termination region. If the scribe line portion of the termination region were not masked, the scribe line portion of the epitaxial layer may be doped with P+ dopants during the P+ implant step of FIG. 21I. A parasitic NPNP silicon controlled rectifier (SCR) would therefore be formed from N+ region 2011 in the active area, to P− region 2006 in the active area, to N− epitaxial layer 2000, and to a P+ region in the scribe line portion of the termination region. In the present invention, polysilicon layer 2003C2 is used in part to prevent a P+ region from being formed in the epitaxial layer of the scribe region.

Because the insulating properties of the oxide 2002 may be compromised during the sawing apart of dice at the scribe line in the scribe region, the polysilicon layer 2003C2 may become electrically connected to the underlying epitaxial layer. To prevent this connection from destroying the function of the device, polysilicon layer 2003C2 is electrically isolated from polysilicon field plate 2003C1 by opening 2013E. The electrical connection between polysilicon layer 2003C2 and the underlying epitaxial layer 2000 therefore prevents a charge from developing on the polysilicon layer 2003C2 and therefore prevents a depletion region from forming underneath the polysilicon layer 2003C2 at the scribe line.

The embodiment of the five step process described in FIGS. 21A-21M also differs from the embodiment described above in FIGS. 7A-20 in several other respects. For example, the embodiment of the five step process involves no extra step of extending a doubly diffused channel outwardly from the annular periphery of the P− region 2006. In the five step process, although P− region 2006 completely separates the P+ contact region 2014A from the underlying N− epitaxial silicon 2000, P− region 2006 is formed with one masking step.

In a second embodiment of the five masking step process, a metal layer is provided on the scribe line portion of the termination region. FIGS. 21A-21K and FIGS. 24A and 24B depict various stages in the manufacturing of a DMOSFET device made in accordance with this second embodiment. The initial steps of the second embodiment of the five masking step process are the same as the initial steps of the first embodiment of the five masking step process. These steps are described above with respect to FIGS. 21A-21K. The later processing steps of the second embodiment represented by FIGS. 24A and 24B replace the later processing steps of the first embodiment represented by FIGS. 21L and 21M.

Figure 24A:
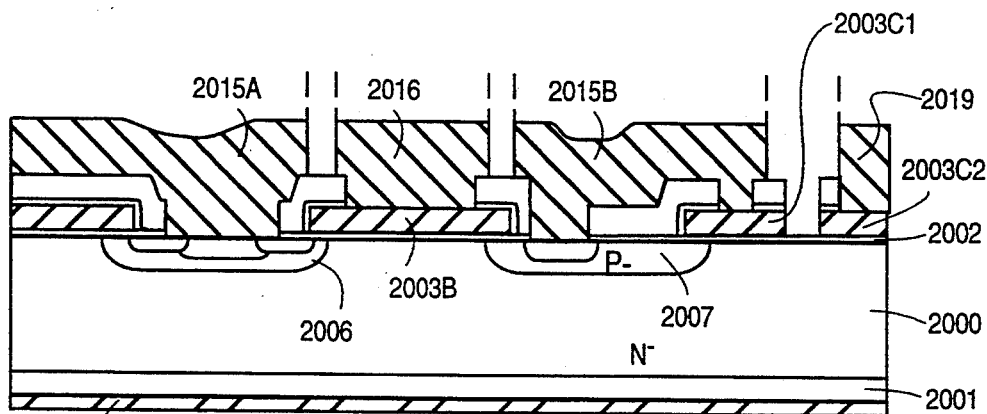
Figure 24B:
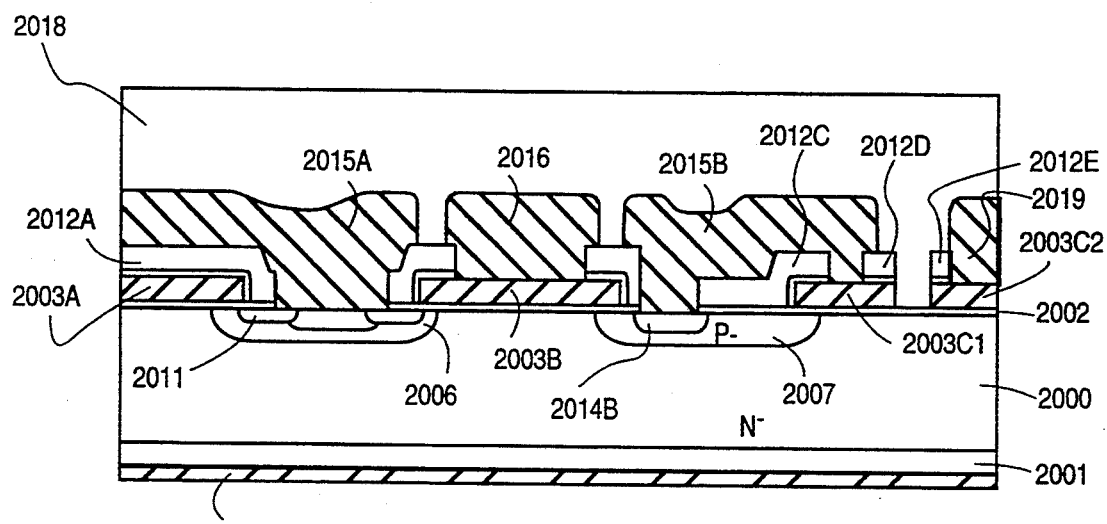

In the fifth masking step of the second embodiment, the metal masking step shown in FIG. 24A, the metal layer 2015 of FIG. 21K is selectively etched to form source metal electrode 2015A, metal gate finger electrode 2016, termination metal 2015B, and protective metal layer 2019. The passivation layer 2018 is then applied over the upper surface of the substrate, the bottom surface of the substrate is backlapped, and a metal drain electrode is sputtered onto the bottom surface of the substrate. A pad masking step is then performed outside the plane of FIG. 24B to form openings in the passivation layer 2018 to expose the gate and source pads 2101 and 2102 of FIG. 22B. The final structure of the second embodiment is depicted in FIG. 24B.

Accordingly, the described embodiment of the five masking step process of the present invention may involve the five following masking steps:
1) Polysilicon Masking Step, in which a polysilicon layer is formed into several polysilicon regions 2003A-2003C;
2) N+ Blocking Masking Step, in which a layer of photoresist is formed in blocking regions 2009 and 2010;
3) Contact Masking Step, in which openings are formed through a BPSG layer and an underlying oxide layer to expose selected regions of underlying silicon or polysilicon where P+ contact regions will be formed;
4) Metal Masking Step, in which a layer of photoresist is used to remove selected portions of a layer of metal to form source electrode 2015A, metal gate finger 2016 and termination metal 2015B; and
5) Pad Masking Step, in which selected portions of a passivation layer are selectively removed to expose the underlying source and gate pads of the final structure.

While our invention has been described with respect to the embodiments set forth above, our invention is not to be considered limited thereto. Various combinable aspects of the embodiments of FIGS. 7A-20 may be combined with various other combinable aspects of the embodiment of the process depicted in FIGS. 21A-21M. Moreover, the terms "five masking step process" and "six masking step process" are used only as descriptive labels to aid the reader in understanding the specification and are not to be considered to limit the scope of the invention which is fully defined by the appended claims. The above-described n-channel vertical DMOSFET processes can be modified to implement p-channel vertical DMOSFETs by reversing junction polarities and converting P type dopants to N tape dopants and vice versa. Furthermore, no particular equipment type is critical in the fabrication of the disclosed structures. The ranges given for the process parameters are illustrative, and do not limit the scope of the claimed invention. Accordingly, these and other embodiments, variations and improvements not described in the specification are to be considered within the scope of our claimed invention.

We claim:

1. A method of fabricating a MOSFET, comprising the steps of:
   providing a semiconductor body of a first conductivity type with (a) a lightly doped well region of a second conductivity type opposite to the first conductivity type and (b) a surface-adjoining body contact region of the second conductivity type such that said body contact region is continuous with, and more heavily doped than, said well region;
   creating a patterned gate electrode over a dielectric layer formed along said semiconductor body; and
   providing said semiconductor body with (a) a surface-adjoining body region of the second conductivity type and (b) a surface-adjoining source of the first conductivity type such that said body region is continuous with said well region and extends beyond its lateral periphery under said gate electrode, the three regions of the second conductivity type forming a surface-adjoining composite region of the second conductivity type where said source is situated in part of said composite region and is spaced apart from semiconductor material of said semiconductor body outside said composite region.

2. A method as in claim 1 wherein the second providing step entails furnishing said semiconductor body with an annular surface-adjoining channel that extends below said gate electrode from said source to semiconductor material of said semiconductor body outside said composite region, both the inner and outer periphery of the channel being generally in the shape of a polygon having more than four sides, each interior angle that joins two of the sides being at least 120 degrees.

3. A method as in claim 2 wherein each polygon has an even number of sides, half of which are longer than the other half, each longer side joining two of the shorter sides.

4. A method as in claim 1 wherein said body contact region is also more heavily doped than said body region.

5. A method as in claim 4 wherein said well region extends into said semiconductor body to a greater depth than said body contact and body regions.

6. A method as in claim 1 wherein a dopant is introduced through a mask window into said semiconductor body during the first providing step to form said body contact region by a procedure that comprises (a) covering the mask window with a doping layer that contains the dopant and (b) causing the dopant to diffuse from the doping layer into said semiconductor body.

7. A method as in claim 1 wherein the first providing step comprises separately introducing first and second dopants of the second conductivity type into said semiconductor body such that the first dopant forms said well region, and the second dopant forms the body contact region.

8. A method as in claim 7 wherein the second dopant is introduced through a first mask window into said semiconductor body by a procedure that comprises (a) covering the first mask window with a doping layer that contains the second dopant and (b) causing the second dopant to diffuse from the doping layer into said semiconductor body.

9. A method as in claim 7 wherein the first dopant is introduced into said semiconductor body before the second dopant.

10. A method as in claim 7 wherein the second providing step comprises (a) introducing a third dopant of the second conductivity type into said semiconductor body through a second mask window substantially bounded by said gate electrode such that the third dopant forms said body region and (b) introducing a dopant of the first conductivity type into said semiconductor body through a third mask window consisting substantially of part of the second mask window.

11. A method as in claim 10 wherein the second mask window is generally in the shape of a polygon having more than four sides, each interior angle that joins two of the sides being at least 120 degrees.

12. A method as in claim 11 wherein the polygon has an even number of sides, half of which are longer than the other half, each longer side joining two of the shorter sides.

13. A method as in claim 12 wherein the number of longer sides is four, each interior angle being approximately 135 degrees.

14. A method as in claim 10 wherein the third mask window is in the shape of an annulus whose outer periphery is substantially formed by said gate electrode and whose inner periphery is formed by a separate mask portion.

15. A method of forming an integrated circuit MOSFET cell in a silicon body of a first conductivity type, comprising the steps of:
   forming a first mask over said silicon body;
   opening a first window that extends at least partially through said first mask over a dopant-introduction site of said silicon body;
   forming a lightly doped well of a second conductivity type opposite to said first conductivity type aligned with said first window;
   diffusing dopant in said lightly doped well laterally and outwardly away from said first window so as to expand said lightly doped well;
   forming a heavily doped region of said second conductivity type aligned with said first window, said heavily doped region being formed within said lightly doped well;
   removing said first mask from said silicon body;
   forming an insulated gate structure over said silicon body;
   opening a second window that extends at least partially through said insulated gate structure over said dopant-introduction site and adjacent material of said silicon body;
   forming a lightly doped region of the second conductivity type through said second window, said lightly doped region extending laterally beyond said lightly doped well and said heavily doped region and under said insulated gate structure;

masking a portion of said heavily doped region within said second window to form a third window; and forming a heavily doped region of said first conductivity type aligned with said third window.

16. A method as in claim 15 wherein:

said second conductivity type is P type; and said heavily doped region of the second conductivity type forms a junction depth shallower than 2.5 microns.

17. A method as in claim 16 wherein said lightly doped well has a depth at least 0.5 micron deeper than said junction depth.

18. A method as in claim 15, wherein said step of forming said heavily doped region comprises the steps of:

forming a glass rich in a dopant of said second conductivity type on said silicon body in said first window; and diffusing dopant from said dopant rich glass into said lightly doped well.

19. A method as in claim 15, wherein all interior angles of said second window are not less than about 120 degrees.

20. A method comprising the steps of:

forming a structure in which (a) a gate insulating layer overlies active and termination areas of a monocrystalline semiconductor body, (b) a gate polycrystalline semiconductor portion lies over said insulating layer largely above the active area, (c) a peripheral polycrystalline semiconductor portion lies over said insulating layer, is laterally separated from said gate polycrystalline portion, and laterally extends above a scribe line part of the termination area, (d) a gate electrode contacts said gate polycrystalline portion, and (e) a source electrode contacts the active area through openings in said insulating layer; and scribing said peripheral polycrystalline portion over the termination area.

21. A method as in claim 20 wherein said peripheral polycrystalline portion substantially laterally surrounds said gate polycrystalline portion.

22. A method as in claim 21 wherein said structure further includes a plurality of source regions situated in the active area.

* * * * *

UNITED STATES PATENT AND TRADEMARK OFFICE
CERTIFICATE OF CORRECTION

PATENT NO.    :   5,429,964
DATED         :   July 4, 1995
INVENTOR(S)   :   Hamza Yilmaz et al It is certified that error appears in the above-identified patent and that said Letters Patent is hereby corrected as shown below:

Item [54] The title should be --METHOD OF FABRICATING POWER MOSFETS--.

Item [57] The abstract should read

--A power MOSFET is fabricated by a process in which a semiconductor body (146/200) is provided with a well region (160) and a body contact region (158) continuous with, and more heavily doped than, the well region. A patterned gate electrode (216) is created over a dielectric layer (214) formed along the upper semiconductor surface. The semiconductor body is then provided with a body region (150) and a source (152). The body region is continuous with the well region and extends beyond its lateral periphery below the gate electrode. The well, body contact, and body regions form a composite region that surrounds the source.--

UNITED STATES PATENT AND TRADEMARK OFFICE
CERTIFICATE OF CORRECTION

PATENT NO.    :   5,429,964
DATED         :   July 4, 1995
INVENTOR(S)   :   Hamza Yilmaz et al It is certified that error appears in the above-identified patent and that said Letters Patent is hereby corrected as shown below:

Col. 1, line 40, "rangeing" should read --ranging--.

Col. 5, line 50, "154 again" should read --154. Again--.

Col. 6, line 53, "BPSG" should read --a--;
         line 54, "layer 224" should read --BPSG layer 224--.

Col. 7, line 45, "type" should be deleted.

Signed and Sealed this

Third Day of November, 1998

Attest:

BRUCE LEHMAN

Attesting Officer          Commissioner of Patents and Trademarks